(12) United States Patent
Richardson et al.

(10) Patent No.: US 6,606,735 B1
(45) Date of Patent: Aug. 12, 2003

(54) METHOD AND SYSTEM FOR USING ERROR AND FILTER LAYERS IN EACH DRC RULE

(75) Inventors: Guy R. Richardson, Cedar Park, TX (US); Dana M. Rigg, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/418,669

(22) Filed: Oct. 14, 1999

(51) Int. Cl.⁷ .............................................. G06K 17/56
(52) U.S. Cl. .............................................. 716/5; 716/6
(58) Field of Search .......................... 716/5, 6

(56) References Cited

U.S. PATENT DOCUMENTS 5,062,054 A * 10/1991 Kawakami et al. ........... 716/11
5,590,049 A * 12/1996 Arora ............................. 716/5
6,275,971 B1 * 8/2001 Levy et al. .................... 716/11

FOREIGN PATENT DOCUMENTS

JP          404196237 A  *  4/1992
JP          408101859 A  *  8/1996

OTHER PUBLICATIONS

McCollister, MJ, et al., "The use of inverse layout trees for hierarchical design verification", Nov. 1999, IEEE, p. 534–537.*
Hedenstierna, N, et al., "The development of a first pass verification module for a SAW filter design automation sustem", Dec. 1991, IEEE, p. 133–136.*
Bamji, CS, et al., "GLOVE: a graph–based layout verifier", Jan. 1994, IEEE, p. 215–220.*
http://www.adiva.com, "DRC—Design Rule Check", Oct. 7, 1999, 2 pps.
http://www.avanticorp.com, "Darcula, Calibre, and Check-Mate Users—Do you want more performance?", Avant! Promotions, May 1, 1999, 2 pps.
http://www.avanticorp.com, Hercules' Verification Strength Unmatched by Cadence's Dracula and Mentor's Calibre, Avant! Promotions, May 1, 1999, 1 pp.

(List continued on next page.)

Primary Examiner—John F. Niebling
Assistant Examiner—Stacy Whitmore
(74) Attorney, Agent, or Firm—Silicon Valley Patent Group LLP; Omkar Suryadevara

(57) ABSTRACT

A method automatically specifies a unique number of an error layer for each DRC rule in a runset. Therefore, all errors related to a given DRC rule are reported by a layout verification tool in the uniquely specified error layer. Furthermore, the method also automatically specifies a unique number of a filter layer that has the same extent as a quality assurance (QA) cell for testing the DRC rule. The filter layer is logically operated (e.g. ANDed) with the error layer to uniquely identify a failure related to the DRC rule (i.e. errors from all other QA cells are filtered out). The QA cells are generated automatically by use of a library of templates. During regression testing, the first time a DRC runset is run against a test design or QA cell library the results are manually verified and stored as "expected" results. Thereafter when the runset changes or a new version of the verification tool becomes available the test data may be used to identify any differences in the new results, by automatic comparison with the expected results. Specifically, the regression testing method graphically compares the new test results with the expected results and highlights the differences. A utility automatically compares a first set and a second set of shapes in the two sets of results, and can be used for comparison of any two drawings (not necessarily integrated circuit layouts).

9 Claims, 14 Drawing Sheets

Microfiche Appendix Included
(6 Microfiche, 585 Pages)

OTHER PUBLICATIONS http://www.avanticorp.com, "Mediamatics introduces Breakthrough System–On–a–Chip for Digital Video Disc Players", Electronics Journal Technology, Jun. 1999, 5 pps.

http://www.avanticorp.com, Silicon Blueprint, "Calibration Tools", Solutions & Products, 1999, 1 pp.

http://www.avanticorp.com, "Avant!'s Nova–Explore RTL Identifies Front–End Design Errors and Enables Reuse of Predictable, Verified RTL Code", Electronics Journal Technical, Apr. 1999, 3 pps.

http://www.avanticorp.com, "Advanced Verification Minimizes Time to Market", Electronics Journal Technical, Apr. 1999, 2 pps.

http://www.avanticorp.com, Hercules–II, "Hierarchical Physical Verification and mask Generation", Solutions & Products, 1999, 4 pps.

Bassak, "Focus Report: Physical Verification Tools", Mar. 1998, 12 pps.

http://www.cadence.com, "Assura Vampire", Physical verification, extraction & analysis, 1999, 5 pps.

http://cas.et.tudelft.nl/~ditzel/publications/MasterThesis/nodel.html, Introduction, 1999, 17 pps.

http://www.designw.com/DRC.HTM, "Design Rule Check (DRC)", dw–2000, 1999, 8 pps.

http://www.edac.org, "Hercules—Avant!'s Leading–Edge Design Tool—Continues Market Momentum by Winning Benchmarks and Contracts", Nov. 3, 1998, 2 pps.

http://www.ele.uri.edu, "Mentor Graphics IC Layout & Verification Tutorial", University of Rhode Island, Dept. of Electrical and Computer Engineering, Jul. 1, 1998, 23 pps.

Meador, "Introduction to Mentor Graphics IC Station", Dept. of Electrical Engineer, W. Virginia Univ. Institute of Tech., Apr. 3, 1997, 12 pps.

Goering, "Mentor utilities prep Calibre for deep–submicron ICs", EE Times, Sep. 22, 1999, 1 pp.

Ng, "CPR E 465 Laboratory Tutorial Lab 4 (v1.1), Polygonal layout & Layout Verification, Week 5", ECpE Dept, Iowa State Univ., Feb. 8, 1999, 28 pps.

Weste, "Principles of CMOS VLSI Design. A Systems Perspective", 2 Ed., 1993, 5 pps.

* cited by examiner

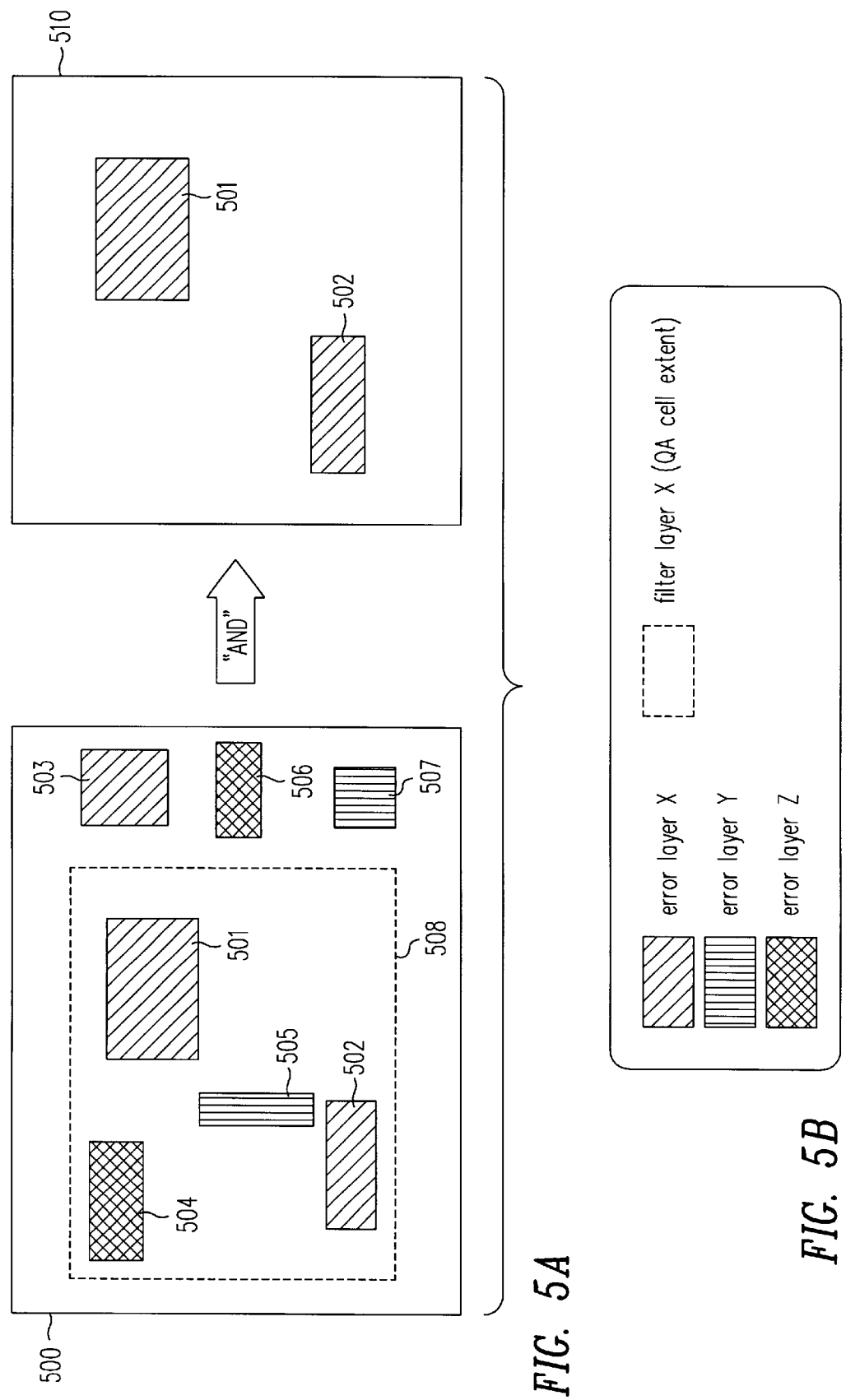

METHOD AND SYSTEM FOR USING ERROR AND FILTER LAYERS IN EACH DRC RULE

CROSS-REFERENCE TO RELATED APPLICATION

This application is related to and incorporates by reference herein in its entirety the concurrently filed, commonly owned U.S. patent application, Ser. No. 09/419,833 filed by Guy R. Richardson, et al., and entitled "Method And System For Automatic Generation Of DRC Rules With Just In Time Definition of Derived Layers".

CROSS-REFERENCE TO ATTACHED SOFTWARE APPENDICES

This patent application includes microfiche Appendices A and B which are a part of the present disclosure, and which are incorporated by reference herein in their entirety. These Appendices consist of a total of 6 sheets that contain a total of 585 frames. Appendices A and B include listings of computer programs and related data including source code in the languages C++ and Perl for implementing runset generator that automatically generates DRC rules in one embodiment of this invention as described more completely below.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

A computer programmed with appropriate software (called layout verification tool) is normally used to verify that a design of an integrated circuit (IC) chip conforms to certain predetermined tolerances that are required by a process to be used in fabricating the chip. Examples of such a layout verification tool include (1) HERCULES software available from Avant! Corporation, 46871 Bayside Parkway, Fremont, Calif. 94538, Tel 510.413.8000, and Web site www.avanticorp.com, (2) VAMPIRE software available from Cadence Design Systems, Inc, 555 River Oaks Parkway, San Jose, Calif. 95134, Tel 408.943.1234, and Web site www.cadence.com, and (3) CALIBRE software available from Mentor Graphics Corporation, 8005 SW Boeckman Road, Wilsonville, Oreg., 97070, Tel 503.685.7000, and Web site www.mentor.com.

Tolerances for the process that is to be used to fabricate the IC chip are often specified in the form of "rules" that are used by the layout verification tool to confirm that a chip's design can be manufactured by the process (in an operation called "design rule check" (DRC)). Examples of DRC rules to be used in checking an IC design include minimum width, minimum spacing between elements of a circuit, minimum width of notches, checks for acute angles and self-intersecting polygons, and enclosure and overlap checks. Such DRC rules can be applied to actual layers that are to be fabricated in the chip. Such DRC rules can also be applied to layers (called "derived layers") that are formed by logical operations (such as not, and, or, and xor) on actual or derived layers or some combination thereof, as described in, for example, pages 164–166 of a book entitled "Principles of CMOS VLSI Design, A Systems Perspective," second edition, by Neil H. E. Weste and Kamran Eshraghian, published by Addison-Wesley Publishing Company that is incorporated by reference herein in its entirety.

Such DRC rules may be supplied by the user through a graphical user interface (GUI), such as "composer" included in software called "dw-2000" available from Design Workshop Inc., 7405 Trans-Canada, Suite 320, St-Laurent, Québec, Canada H4T IZ2, Web site www.designw.com. DRC rules are normally stored in a computer file commonly called a "runset" (also called "rule set," "rule file," "rule deck," or "rule scripts"). The runset is supplied as input to the layout verification tool to check if a design conforms to the DRC rules in the runset. The DRC rules are commonly expressed in a computer language that is specific to each layout verification tool (such as the "Standard Verification Rules Format" (SVRF) used by CALIBRE, as described at Web site www.mentor.com/calibre/datasheets/calibre/index.html). According to Mentor Graphics, an SVRF optimizing compiler automatically tunes the order and type of operations performed during verification. These optimizations include eliminating redundant steps and combining similar operations into parallel computations.

Moreover, Mentor Graphics states at the above-described web site that an "automatic rule deck converter" enables designers to get started right away, taking advantage of their existing rule decks. Such converters normally convert from the native language of one layout verification tool to the native language of another layout verification tool, thereby to allow the user to switch tools. Other such converters include utilities named A2drc (that translates the design rules from a Milkyway database to a Hercules DRC runset file) and A2lvs (that translates netlist information from a Milkyway database to a Hercules LVS runset file) which are available in the HERCULES software (described above).

SUMMARY OF THE INVENTION

A method in accordance with the invention automatically specifies a unique number of an error layer for each DRC rule in a runset. Therefore, all errors related to a given DRC rule are reported by a layout verification tool in the specified error layer, and so all errors can be viewed by simply turning off a display of other layers in a schematic editor. Furthermore, in one embodiment, the method also automatically specifies a unique number of a filter layer that has the same extent as a quality assurance (QA) cell, and the filter layer can be logically operated (e.g. ANDed) with the error layer to uniquely identify a failure related to the DRC rule being checked. The use of unique error and filter layers eliminates spurious errors that are normally generated by QA cells designed to test other DRC rules, but which end up violating the DRC rule being checked.

QA cells of the type described above can be generated automatically by use of a template, which is identified by the user from among a library of templates (either through a set of commands that define the QA cell in a meta language, or through a graphical user interface, or some combination thereof). The template can be implemented as a macro definition or as a function in a high level programming language. Use of such templates allows automatic generation of QA cells, and so QA cell development and maintenance efforts are dramatically reduced. Moreover, regression testing using QA cells is simplified. Furthermore, template-generated QA cells are easily regenerated when layers or rules change. Also, such QA cells have a consistent appearance. Moreover, template-generated QA cells can be written in "stream" format, thereby enabling the cells to be merged into QA cell libraries containing other, more complex test data.

In a regression testing method in accordance with the invention, the first time a runset is run against a test design or QA cell library the results are manually verified and stored as "expected" results. Thereafter when the runset changes or a new version of the verification tool becomes available the test data may be used to identify any differences in the results. Specifically, the regression testing method graphically compares the new test results with the expected results and highlights the differences.

The graphical comparison can be performed by a utility that automatically compares a first set and a second set of shapes. Each shape in the two sets is defined in a record having a field that identifies the type of shape (examples include circle, polygon, wire and boundary), and a list of one or more points, each point having two coordinates (e.g. x,y coordinates of the origin of a circle, or of one point in a polygon). The utility uses a hash function (e.g. simply add up all the coordinates in a list), to generate a hash number, and the records are indexed by their hash number. Thereafter, for each shape in the first set, the utility looks up shapes in the second set that have identical hash numbers, and then compares records in the two sets to confirm that the shapes are identical.

Such an automated comparison eliminates the possibility of human error associated with reviewing large quantities of test results. The test review time is dramatically reduced, because the user can focus on the differences between the two groups of shapes (which may be displayed in different colors, for example). Moreover, in one implementation, "stream" format is used to avoid dependence on specific tools.

BRIEF DESCRIPTION OF THE DRAWINGS

FIG. 5A illustrates use of a filter layer having a shape that is of the same extent as a QA cell, and use of such filter layer to isolate errors related to the QA cell, both in accordance with the invention.

FIG. 5B illustrates, in a key, hatching of different types used to denote errors from different QA cells in the error layer illustrated in FIG. 5A.

DETAILED DESCRIPTION

Figure 1:
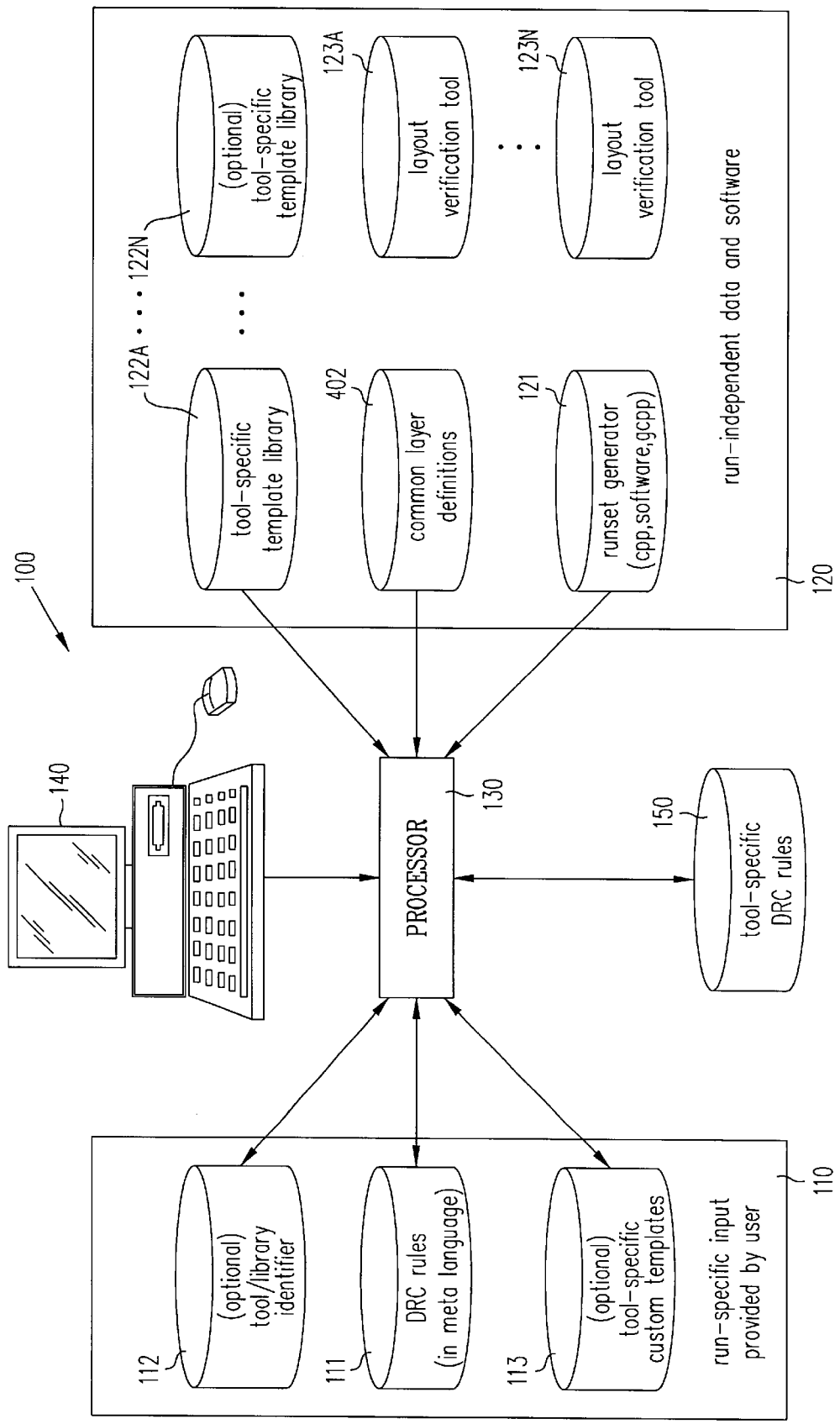
FIG. 1 illustrates, in a high level block diagram, a system for generating runsets for checking an IC design in accordance with the invention.

In accordance with the invention, instead of a user creating runsets in a language of a specific verification tool (also called "native language"), the user expresses the DRC rules 111 (FIG. 1) in a high level programming language (also called "meta language") that is independent of the native language. The meta language includes, in addition to normal constructs of the high level programming language, a set of keywords that identify DRC rules from an abstract viewpoint, unrelated to any native language. Such a meta language can cover several aspects of verification, including overall descriptive information (such as grid spacing), constructs for the creation of Boolean operations, descriptions of device formation for LVS, and constructs for the expression of rules. The meta language can be designed to conform with any high level programming language, such as C, C++, Perl or Tcl.

In one embodiment, the meta language is implemented by categorizing DRC rules into several types, and templates (also called "DRC templates") are written for each type, using parameters to identify layers, values of tolerances, etc. to map each DRC rule in the meta language into one or more rules in the native language. In addition to or instead of the just-described method, rules in a specific native language can be divided up into groups that have some common feature, and a template written for each group of rules to allow any rule in the group to be generated by use of that template. Such a template contains a parameterized representation of each rule in the group (e.g. one or more parameters are used to identify a unique rule in the native language).

In one example, a verification tool's native language uses the following keywords: m1space—keyword denotes metal 1 spacing, m1width—keyword denotes metal 1 width, m2space—keyword denoting metal 2 spacing, m2width—keyword denoting metal 2 width, m3space—metal 3 spacing, etc. In a meta language for the example, all these keywords are replaced by just two keywords: L1space—keyword for checking spacing in any single layer, L1width—keyword for checking width in any single layer, and the layer number is passed as a parameter to the template for translation into an appropriate keyword in the tool's native language.

The above-described templates are grouped into one of a number of libraries 122A–122N (wherein A≦K≦N, N being the total number of such libraries), one each for a corresponding number of layout verification tools 123A–123N. The templates can be written in the above-described high level language to which the meta language conforms (for example, the templates can be written in C or C++). Therefore, templates in a library 122K can be in a macro language that is interpreted, or in a compiled language.

The templates are dynamically loaded into processor 130 (FIG. 1) when executing software (also called "runset generator") 121 that translates DRC rules in the meta language into instructions (also called "code") in the native language of a user-specified verification tool 123K. Note that the instructions generated by runset generator 121 by use of a template library 122K need not be limited to the native language of the verification tool, and instead can be macros that are then processed either by a preprocessor (such as gccp), or by the verification tool itself (such as HERCULES). This affords users of runset generator 121 maximum flexibility with respect to rule implementation. In one example, runset generator 121 is used with a set of templates that implement more than 75% of the rules commonly found in a Hercules DRC runset.

Figure 2:
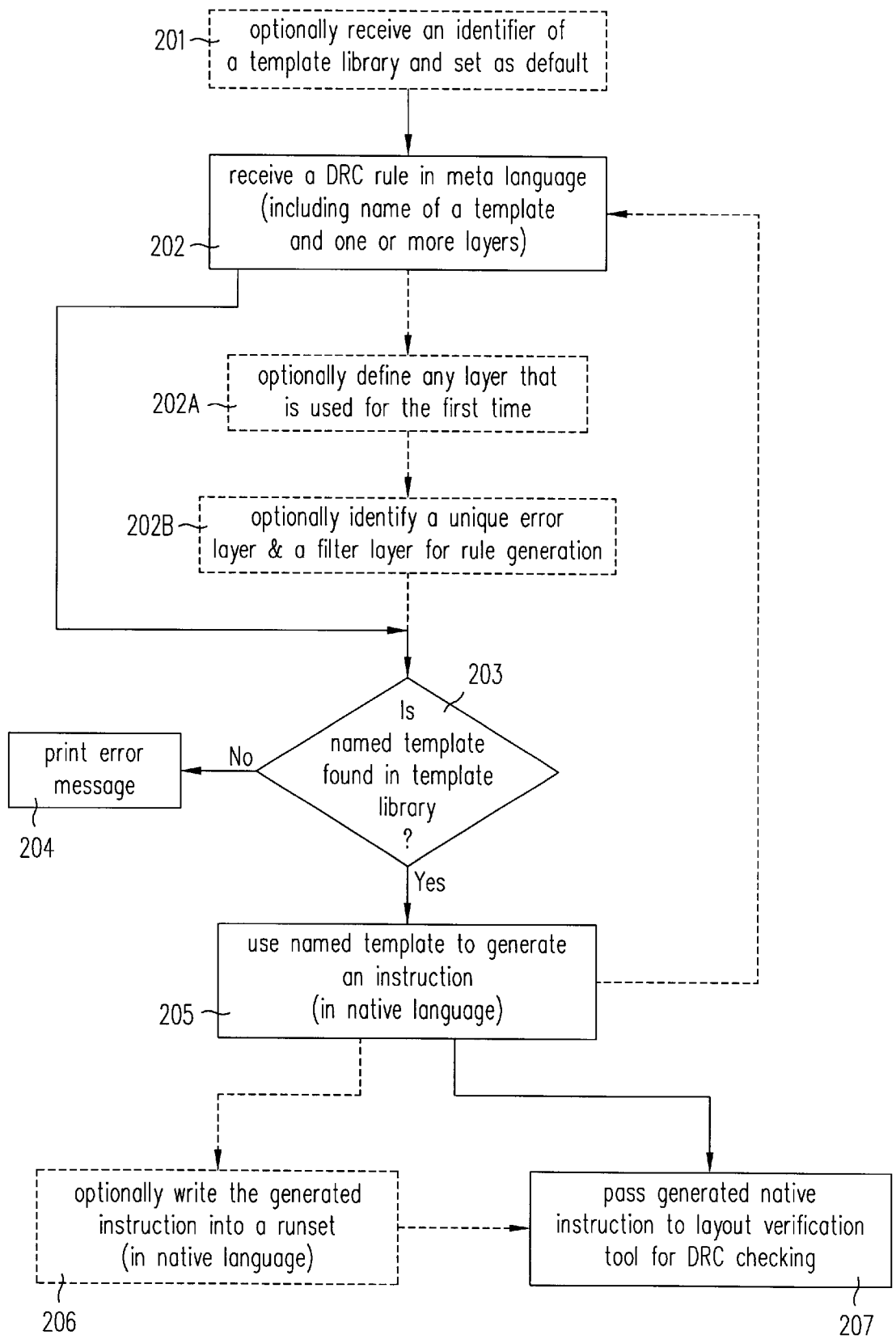
FIG. 2 illustrates, in a high level flow chart, operations performed by the system illustrated in FIG. 1.
Figure 3A:
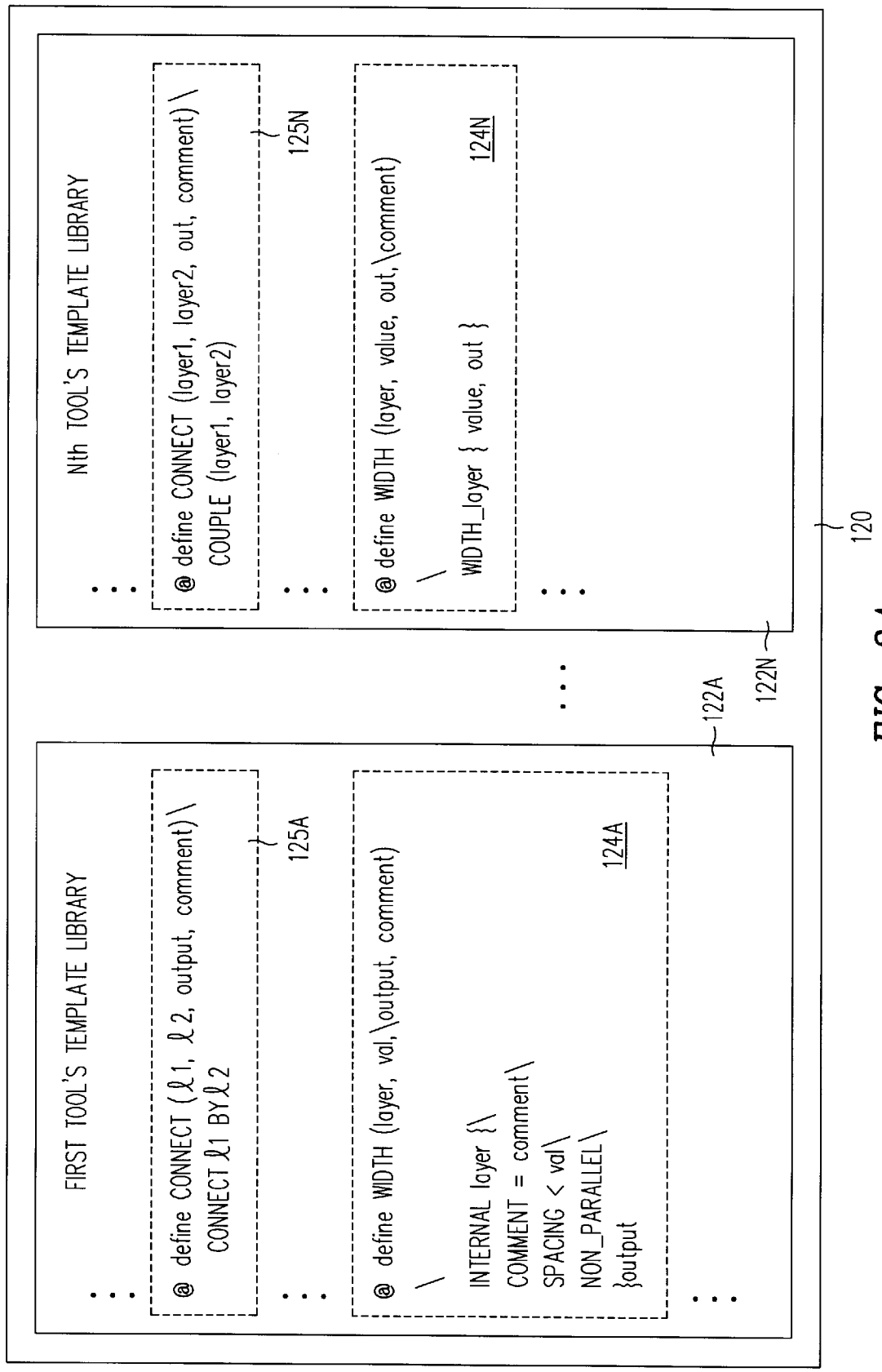
FIG. 3A illustrates examples of DRC rule templates having the same name included in template libraries for generating native code of two different tools in accordance with the invention.

If a number of tools 123A–123N are available to the user, the user identifies (see act 201 in FIG. 2) to processor 130 (FIG. 1), via an I/O device 140 a specific tool 123K (and therefore a specific native language) to be used to verify an IC design. Note that each of libraries 122A–122N includes templates for the same set of key words that are defined in the meta language, and therefore only one of these libraries needs to be selected by the user. For example, as illustrated in FIG. 3A, each of libraries 122A–122N includes a corresponding one of templates 124A–124N that defines the keyword "WIDTH," and another one of templates 125A–125N that defines the keyword "CONNECT."

Depending on the native language used by the respective tools 123A–123N, code generated by each template can be different: e.g. template 124A invokes an instruction "INTERNAL" that is specific to tool 123A, whereas template 124N invokes one of several instructions "WIDTH_1," "WIDTH_2," "WIDTH_3," . . . "WIDTH_Z" that are specific to tool 123N. Therefore, processor 130 stores an identifier 112 (FIG. 1) of a tool specified by the user as a default for identifying a library of templates to be used in generation of a runset in the native language. Note that act 201 is an optional act that is not necessary, for example if the user has access to only one verification tool (which is then set up as the default).

Next, in act 202 (FIG. 2), runset generator 121 receives a DRC rule that has been specified by the user in the meta language. Information provided by the user to specify the DRC rule includes: a name of the template, the layer(s) on which the DRC check is to be applied, and values to be used in applying the DRC rule. Then, runset generator 121 searches (in act 203 of FIG. 2) template library 122K (that is the current default) for the template having the name that is received from the user, and if no such template is found, prints an error message (in act 204 of FIG. 2). On finding the template, runset generator 121 generates (in act 205 of FIG. 2) an instruction in the native language of the default verification tool 123K. Thereafter, if there are additional DRC rules to be processed, runset generator 121 returns to act 202 (described above).

At some later point, the generated native language instructions are passed to the default verification tool 123K for performing the actual DRC checks on an IC design (that may be a simple test design, or an actual design). Depending on the implementation, the generated native language instructions may be first stored in an intermediate file (also called native language runset) 150 prior to passage to tool 123K. Also depending on the embodiment, instead of or in addition to act 201 (described above), runset generator 121 can optionally perform one or more of acts 202A and 202B between acts 202 and 203 (described above).

To summarize, the user specifies DRC rules in the meta language by specifying: (1) the name of a DRC template that contains an expression of the rule in the native language, (2) layers to which the rule applies, and (3) values associated with the rule. After specifying the DRC rules in the meta language, the user uses runset generator 121 to cause processor 130 to translate DRC rules 111 into the native language of a specific tool that the user plans to use for verification of an IC design.

In one implementation, runset generator 121 processes only one DRC rule at a time from a file of such rules expressed in the meta language (also called "meta runset"). Specifically, such a runset generator 121 reads each DRC rule, and then generates a rule in the native language based on one or more templates provided for that native language. Therefore, runset generator 121 maintains the order of DRC rules unchanged, thereby to allow the user to group the DRC rules in a meta runset 111 in a hierarchical fashion, to define modules that are meaningful to the user.

In an optional act 202A, runset generator 121, although maintaining the order of user-specified DRC rules, changes the order of layer derivations, by inserting definitions for derived layers immediately prior to the first use of a layer (also called "just-in-time" layer definition). Such just-in-time layer definition reduces memory usage of the verification tool 123K, and ensures that unused physical layers or derived layers do not appear in DRC runset 150 (FIG. 1) which contains code in the native language.

Figures 3B, 3C:
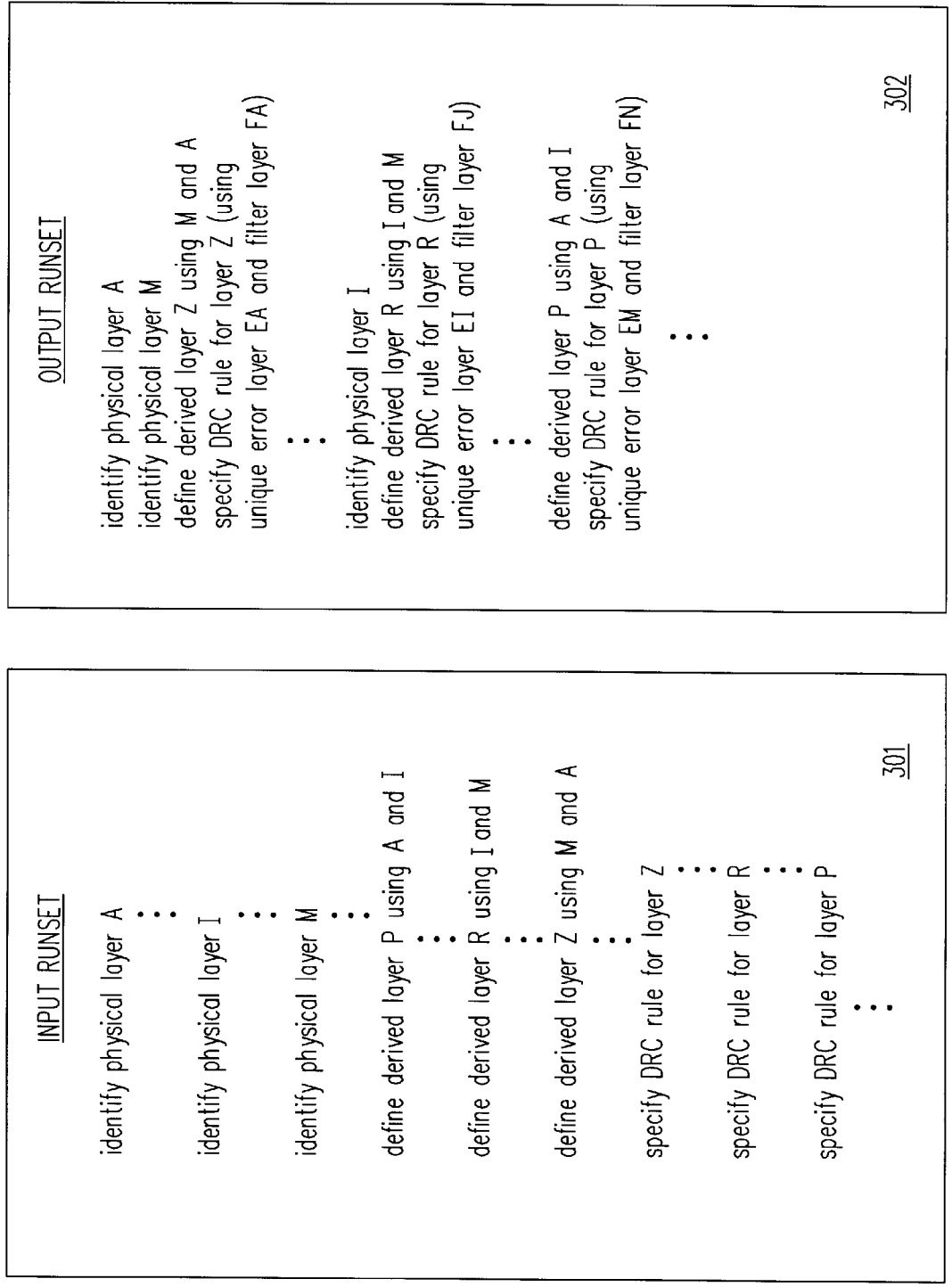
FIGS. 3B and 3C illustrate rearrangement of DRC rules from an input to an output file respectively resulting from performance of two operations, namely defining layers just-in-time, and identifying error and filter layers as illustrated in FIG. 2.

In one example illustrated in FIG. 3B, the user prepares an input runset 301 which is preferably, but not necessarily expressed in the meta language; in other embodiments runset 301 can be expressed in a native language, and the just-in-time layer definition is used just to re-arrange the lines; note that just-in-time layer definition can also be used in a converter that converts from one native language to another.

In the example, runset 301 is prepared in the following manner: the user first identifies a number of physical layers A . . . M (wherein $A \leq I \leq M$, M being the total number of physical layers), the user next defines a number of derived layers, M (wherein $P \leq R \leq Z$, Z being the total number of derived layers), the user then specifies a number of DRC rules. In this example, the DRC rules use the derived layers in the reverse order in which they were defined, e.g. the first DRC rule uses layer Z, and a later DRC rule uses layer R.

When input runset 301 is processed by just-in-time layer definition, there is nothing provided in the output runset 302 until the first DRC rule is read, and at that time, the use of layer Z in this DRC rule causes physical layers A and M to be first identified (because layer Z is derived from a logical operation on layers A and M), followed by definition of derived layer Z followed by specification of the first DRC rule. Next, when the DRC rule that uses layer R is read, the physical layer I is identified (because layer R is derived from a logical operation on layers I and M), followed by definition of derived layer R (as physical layer M is already identified). Then this DRC rule is specified in output runset 302.

Therefore, just-in-time layer definition defines derived layers just before they are used in a DRC rule. Note that just-in-time layer definition can be used even when the definition of a derived layer (also called "defined layer") is made early (followed by a number of DRC rules that are unrelated to the definition), as long as there is not an intervening definition of another derived layer prior to use of the defined layer in a DRC rule.

In act 202B, runset generator 121 specifies a unique number of an error layer to be used by tool 123K to indicate failure of a design to conform to a DRC rule applied to the layer. For example, when the first DRC rule is written to output runset 302, the specification of this rule includes an error layer EA which is a unique layer associated with only this first rule. Such allocation of a unique error layer ensures that errors found by a layout verification tool during performance of first DRC check are isolated (i.e. only errors from this first rule are reported in this error layer EA). In act 202B, if a test feature is to be used in the DRC check, for example to perform regression testing, runset generator 121 also specifies a unique number of a filter layer FA to be logically operated with error layer EA (e.g. logically ANDed), to uniquely identify failures caused only by the test feature (also called QA cell). The extent of filter layer FA is defined to cover only the test feature, so that errors caused by the test feature are isolated, and can be compared with a set of expected errors to confirm that the DRC check is operating correctly.

Figure 4A:
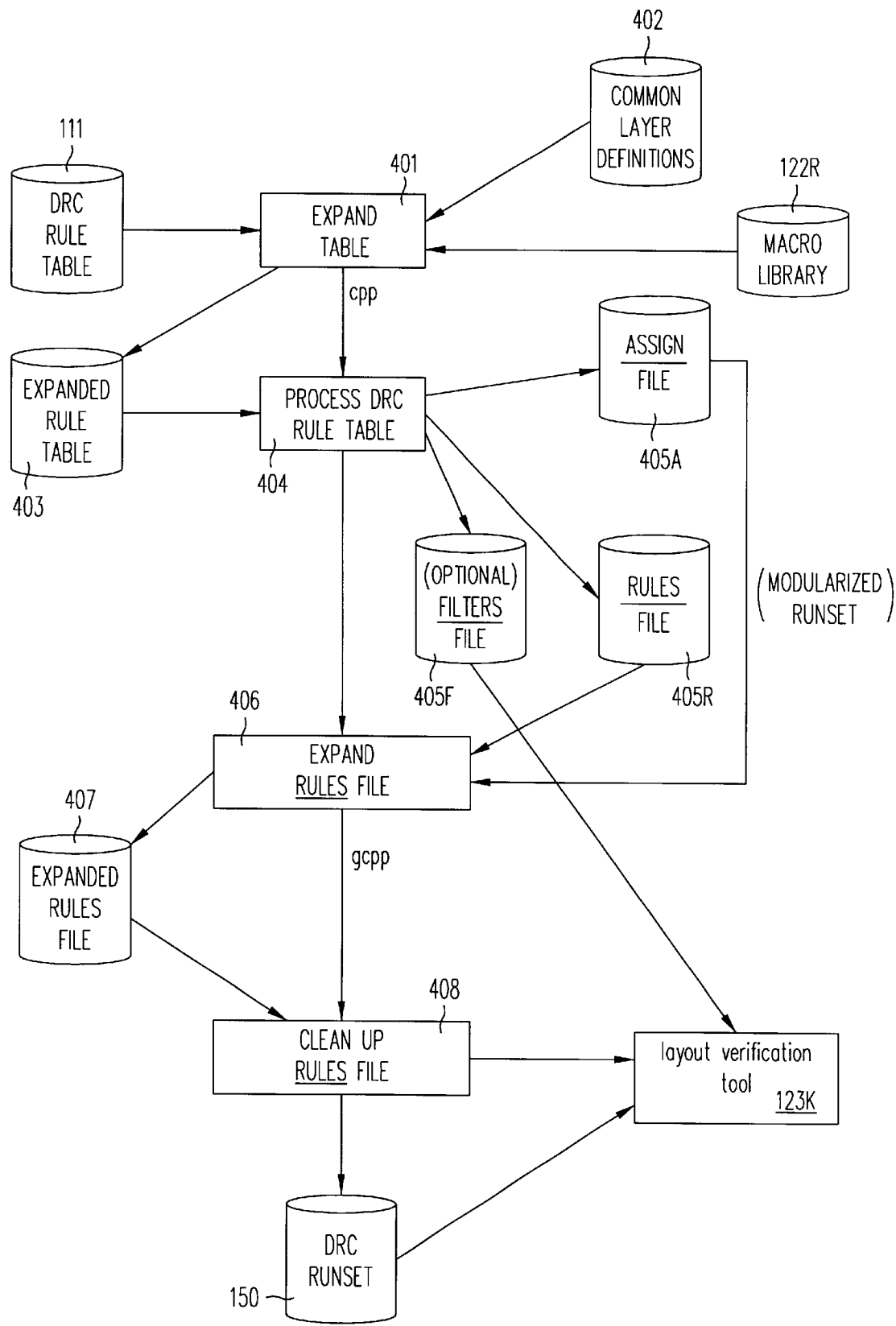
FIG. 4A illustrates, in a high level block diagram, data flow in one exemplary implementation of the system illustrated in FIG. 1.

In one implementation of the type illustrated in the attached Appendix A, runset generator 121 includes use (as illustrated by act 401 in FIG. 4A) of the C++ language utility "cpp" (such as version 2.8.1 available from, for example Free Software Foundation, 59 Temple Place—Suite 330, Boston, Mass. 02111-1307, USA Email: gnu@gnu.org, Website: http://www.gnu.org, Voice: +1-617-542-5942, and Fax: +1-617-542-2652) to convert meta runset 111 into an expanded rule table 403. Such use is illustrated by invocation of the utility "make" (such as version 3.76.1 (1997) also available from the Free Software foundation), in the attached Appendix A, files AriesCode/src/Make.rules, AriesCode/src/Make.defines, AriesCode/src/Makefile.generic. In this implementation, meta runset 111 (e.g. see file "AriesCode/src/modules/demo/demo.table" in Appendix A) contains lines that contain the following fields (wherein each field is separated by commas, and elements within a field are separated by semicolons): template name, rule name, values to be passed to template, comment, layer names.

Examples of DRC rules expressed in the meta language in the file "demo.table" are as follows (wherein the runset is generated for the native language of the tool HERCULES available from Avant! Corporation):

```
SPACE_AND_NOTCH
---------------
Outputs EXTERNAL command which checks input layer for spacing and
notch. Use this macro to check for notch and spacing errors when notch
and spacing rule are the same value. If the notch rule is different than
the spacing rule, then you need to use both the SPACE and
NOTCH macros.
EXAMPLE INPUT:
SPACE_AND_NOTCH, 502, 0.60, "M1 space to M1 >=
$value", METAL1
EXAMPLE HERCULES OUTPUT:
/*** CODE FRAGMENT GENERATED BY MACRO
"SPACE_AND_NOTCH" ***/
EXTERNAL METAL1 {
COMMENT = "502: M1 space to M1 >= 0.60"
SPACING < 0.60
TOUCH
NON_PARALLEL
CHECK_SAME_POLYGON
} (8;254)
SPACE_AND_NOTCH_RUNLENGTH
-------------------------
Outputs EXTERNAL command which checks input layer for a minimum
spacing and notch, as well as a spacing and notch for long run lengths.
Use this macro to check for notch errors when notch and spacing rule are
the same value. If the notch rule is different than the spacing rule, then
you need to use both the SPACE_RUNLENGTH and
NOTCH_RUNLENGTH macros.
EXAMPLE INPUT:
SPACE_AND_NOTCH_RUNLENGTH, 1_5_a, minVal=0.4;
longVal=0.9;run=0.65,\
    "POLY space to POLY (run <= $run) >= $minVal (run > $run) >=
$longVal",\
    POLY
EXAMPLE HERCULES OUTPUT:
/*** CODE FRAGMENT GENERATED BY MACRO
"SPACE_AND_NOTCH_RUNLENGTH" ***/
/*** CODE FRAGMENT GENERATED BY MACRO
"SPACE_RUNLENGTH" ***/
EXTERNAL POLY {
COMMENT = "1_5_a: POLY space to POLY (run <= 0.65 ) >=
0.4 (run > 0.65) >= 0.9"
SPACING < 0.4
LONGEDGE > 0.65
LONGEDGE_TO_EDGE < 0.9
TOUCH
NON_PARALLEL
} (226;5)
/*** CODE FRAGMENT GENERATED BY MACRO
"NOTCH_RUNLENGTH" ***/
NOTCH POLY {
COMMENT = "1_5_a: POLY space to POLY (run <= 0.65) >=
0.4 (run > 0.65) >= 0.9"
SPACING < 0.4
LONGEDGE > 0.65
LONGEDGE_TO_EDGE < 0.9
TOUCH
NON_PARALLEL
} (226;5)
WIDTH
-----
Outputs INTERNAL command which checks input layer for a minimum
width.
EXAMPLE INPUT:
WIDTH, 50, 0.60, "ACT width >= $value (silicide)", ACT
EXAMPLE HERCULES OUTPUT:
/*** CODE FRAGMENT GENERATED BY MACRO "WIDTH" ***/
INTERNAL ACT {
COMMENT = "50: ACT width >= 0.60 (silicide)"
SPACING < 0.60
NON_PARALLEL
} (1;256)
```

In addition, commands to the verification tool itself can be included in such a meta runset 111, as illustrated by file "demo.table" in Appendix A, and that are described below:

```
%assign_layer
-------------
Assign a name to a physical layer.
EXAMPLE:
%assign_layer  ACTIVE       (1;0)
%assign_layer  POLY (2;0)
%assign_layer  NWELL (5;0)
HERCULES OUTPUT:
ASSIGN {
    POLY (2;0)
    NWELL (5;0)
    ACTIVE (1;0)
}
%derived_layer
--------------
Create a logical layer from previously defined layers.
EXAMPLE:
%derived_layer nactive NOT(ACTIVE,PPLUS)
HERCULES OUTPUT:
BOOLEAN ACTIVE NOT PPLUS TEMP= nactive
%error_layer
------------
Change the output error layer to use for the next rule definition in the
meta-language file.
EXAMPLE:
%error_layer 226
WIDTH, 50, 0.60, "ACT width >= $value (silicide)", ACT
HERCULES OUTPUT:
/*** CODE FRAGMENT GENERATED BY MACRO "WIDTH" ***/
```

-continued

```
INTERNAL ACT {
COMMENT = "50: ACT width >= 0.60 (silicide)"
SPACING < 0.60
NON_PARALLEL
} (226;0)
%error_datatype
---------------
Change the output error datatype to use for the next rule definition in the
meta-language file.
EXAMPLE:
%error_datatype 14
WIDTH, 50, 0.60, "ACT width >= $value (silicide)", ACT
HERCULES OUTPUT:
/*** CODE FRAGMENT GENERATED BY MACRO "WIDTH" ***/
INTERNAL ACT {
COMMENT = "50: ACT width >= 0.60 (silicide)"
SPACING < 0.60
NON_PARALLEL
} (226;14)
%variable
---------
Create a meta-variable with an assigned value that may be used layer in
the meta-language file.
EXAMPLE:
@define LIBAR_LONG(leveled_libar,min_area,libar_long)\
AREA leveled_libar {\
    CELL_LEVEL RANGE = [ min_area + DELTA, INFINITY ]\
} TEMP=libar_long
%variable 175     0.50
%variable libar_long 20.0
%derived_layer libar_long LIBAR_LONG(lvl_LIBAR,
$libar_long*$175)
HERCULES OUTPUT:
AREA lvl_LIBAR {
    CELL_LEVEL RANGE = [ 20.0*0.50 + 0.001, 999999999 ]
} TEMP= libar_long
%quote
------
Copy the remainder of the line to the runset being written.
EXAMPLE:
%quote /* The following rule is under review and subject to change . . .
*/
HERCULES OUTPUT:
/* The following rule is under review and subject to change . . . */
```

Expanded rule table 403 is obtained by inserting a line containing a command (e.g. "@include macro library") to include an appropriate library of templates that has been previously identified by the user. A costom library of templates 113 (e.g. see the file "demo.macros" in Appendix A), if defined by the definitions 402 that are common to all runsets, e.g. as defined in files "assign_layers" and "derived_layers" in Appendix A, are also included in expanded rule table 403.

Figures 1, 4B:
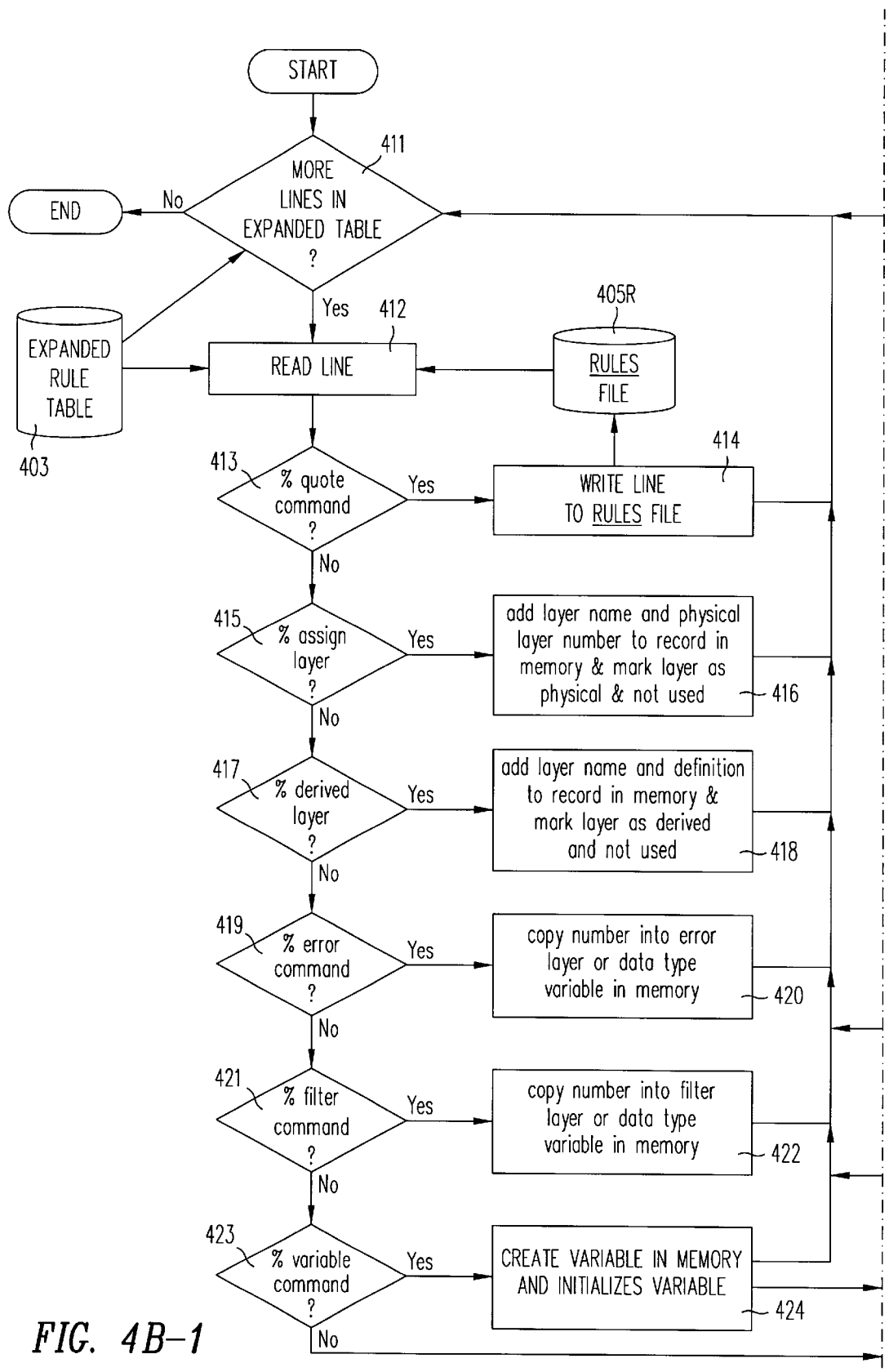
FIGS. 4B and 4C illustrate, in a low level flow chart, act performed in the implementation illustrated in FIG. 4A.
Figures 2, 4B:
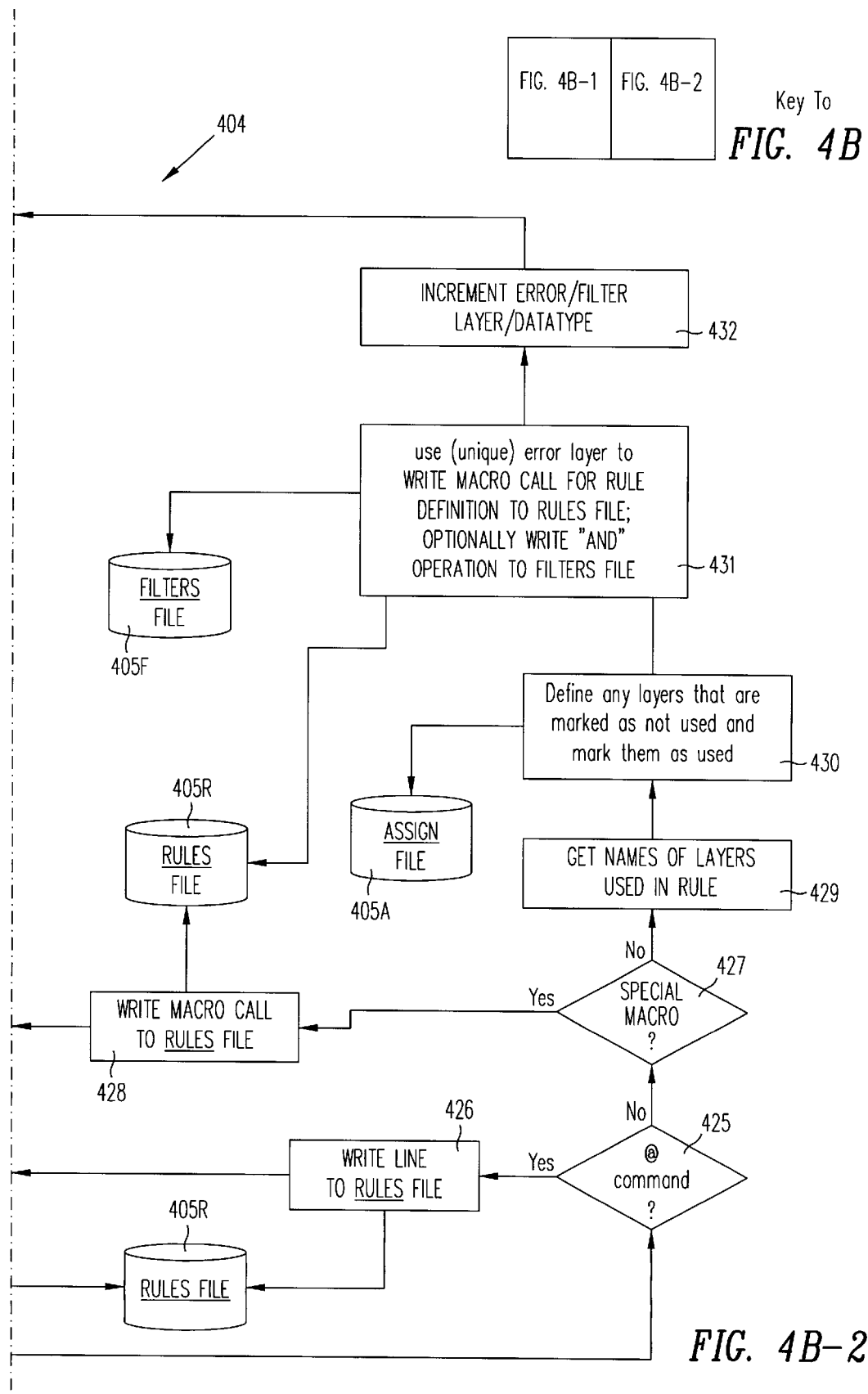

Next, runset generator 121 invokes a procedure 404 (e.g. see file "aries.pl" in Appendix A) to process the lines in the expanded rule table 403 for the above-described just-in-time layer derivation, and definition of unique error layers and filter layers. An example implementation of procedure 404 is described below in reference to FIGS. 4B and 4C. Procedure 404 generates two intermediate files 405A and 405R that respectively relate to layers and rules and that are respectively illustrated in Appendix A by the files:
AriesCode/src/modules/demo/CMOS1/demo_6lm_1tm.assign and
AriesCode/src/modules/demo/CMOS1/demo_6lm_1tm.rules.

Optionally, procedure 404 can also generate a third intermediate file 405F that contains a number of logical operations (e.g. AND operations), each operation being between an error layer identified in the DRC rules in file 405R and a unique filter layer, thereby to isolate any failures generated by a QA cell to test a specific DRC rule.

Then, runset generator 121 invokes a utility "gccp" which is a modified version of the above-described "cpp" tool, wherein the source code has been modified to process commands starting with the "@" sign instead of the "#" sign. Utility "gcpp" uses the templates in macro library 122K (invoked by statement "@include" that was inserted by act 401 into expanded rule table 403), thereby to implement act 205 discussed above in reference to FIG. 2. Utility "gcpp" generates an expanded rules file 407 of the type illustrated in Appendix A by the file:
AriesCode/src/modules/demo/CMOS1/demo_6lm_1tm.rules_exp.

Thereafter, runset generator 121 invokes a cleanup procedure 408 as illustrated by an "awk" script (of the type illustrated in Appendix A by the file AriesCode/src/clean_runset), with the expanded rules file 407 as input. The awk script removes extra blank lines and "@-" that appear at the beginning of lines containing runset code, thereby to provide as output the DRC runset 150 (e.g. see files with extension ".drc" and ".ev" in Appendix A). Note that in an alternative implementation, files 405A and 405R are directly used, when the verification tool, such as HERCULES version 98.4 includes the capability to process macro calls (e.g. includes a built-in "gccp" software, or other such preprocessor).

In one implemenation, procedure 404 (illustrated by file "aries.pl" in Appendix A) checks in act 411 if there are more lines to be processed in expanded rules table 403, and ends if there are no more lines. If there is a line to be processed, procedure 404 reads the line in act 412, and thereafter parses the read line as follows. If the line contains a "%quote" token (see act 413) which is used to indicate text to be copied directly into the rules file 405R, procedure 404 writes (see act 414) the line out into rules file 405R.

If the line contains a "%assign" token (see act 415) which is used to indicate the physical layer number of a layer to be formed in the integrated circuit, procedure 404 stores the information in a record in memory (see act 416), and also marks the record as containing a physical layer that has not yet been used in a DRC rule (note that such marking can be accomplished in a default manner, e.g. if the values of such marking are "0" which is the default value in an initialized record; and in such a case no extra acts need be performed to "mark" the record).

In a similar manner, if the line contains a "%derived" token (see act 417) which is used to indicate the layer is derived from logical operations on one or more other layers, procedure 404 stores the information in a record in memory (see act 418), and also marks the record as containing a derived layer that has not yet been used in a DRC rule.

Note that the above-discussed record for a layer may include a first field for holding a name of the layer, a second field for holding a flag indicating whether the layer has been "used," and a third field for holding another flag indicating whether the layer is a physical layer to be formed in an integrated circuit or a derived layer. If the layer is a physical layer the record can include a fourth field for holding a number indicating the physical position of the layer in a set of layers to be formed in an integrated circuit. If the layer is a derived layer the record can include a fourth field for holding an instruction that performs at least one logical operation on at least one other layer.

If the line contains a "%error" token (see act 419) which is used to indicate the layer number of an error layer to be used by the layout verification tool 123K to report errors, procedure 404 updates the specified value in an appropriate variable in memory (see act 420). Note that there are two types of "%error" tokens in this implementation ("%error_ layer" and "%error_datatype"), and the respectively appropriate variables are updated with the values provided by the user. Note further that procedure 404 uses the user-specified values only for error layers for the next DRC rule, and identifies a number of additional error layers for subsequent DRC rules by incrementing these values by one for each DRC rule.

In a similar manner, if the line contains a "%filter" token (see act 421) which is used to indicate the layer number of a filter layer (used as described elsewhere herein), procedure 404 again updates the specified value in an appropriate variable in memory (see act 422).

If the line contains a "%variable" token (see act 423) which is used to indicate a variable to be used later in the expanded rules file 403, procedure 404 creates (see act 424) a variable with the specified value in memory for subsequent substitution when the variable is later encountered in 403. Such substitution can occur in of, for example, acts 416, 418, 420, 422, 428 and 431.

If the line contains a "@command" token (see act 425) which is used to indicate a command to the "gccp" utility, procedure 404 writes (in act 426) the entire line into rules file 405R.

If the line contains one of the following tokens: "REDUNDANT", "TBD", "DEFERRED_NODAL" or "RECOMMENDED", these tokens are handled as special macros (see act 427), by simply writing (see act 428) the appropriate macro call to rules file 405R. These macros are illustrated in appendix A by the file: AriesCode/common/macros.

Note that after each of acts 414, 416, 418, 420, 422, 424, 426 and 428, procedure 404 simply returns to act 411 (described above). In act 427, if none of the special macro tokens are found, then the line contains a DRC rule, that is processed in acts 429–432 as follows.

Figure 4C:
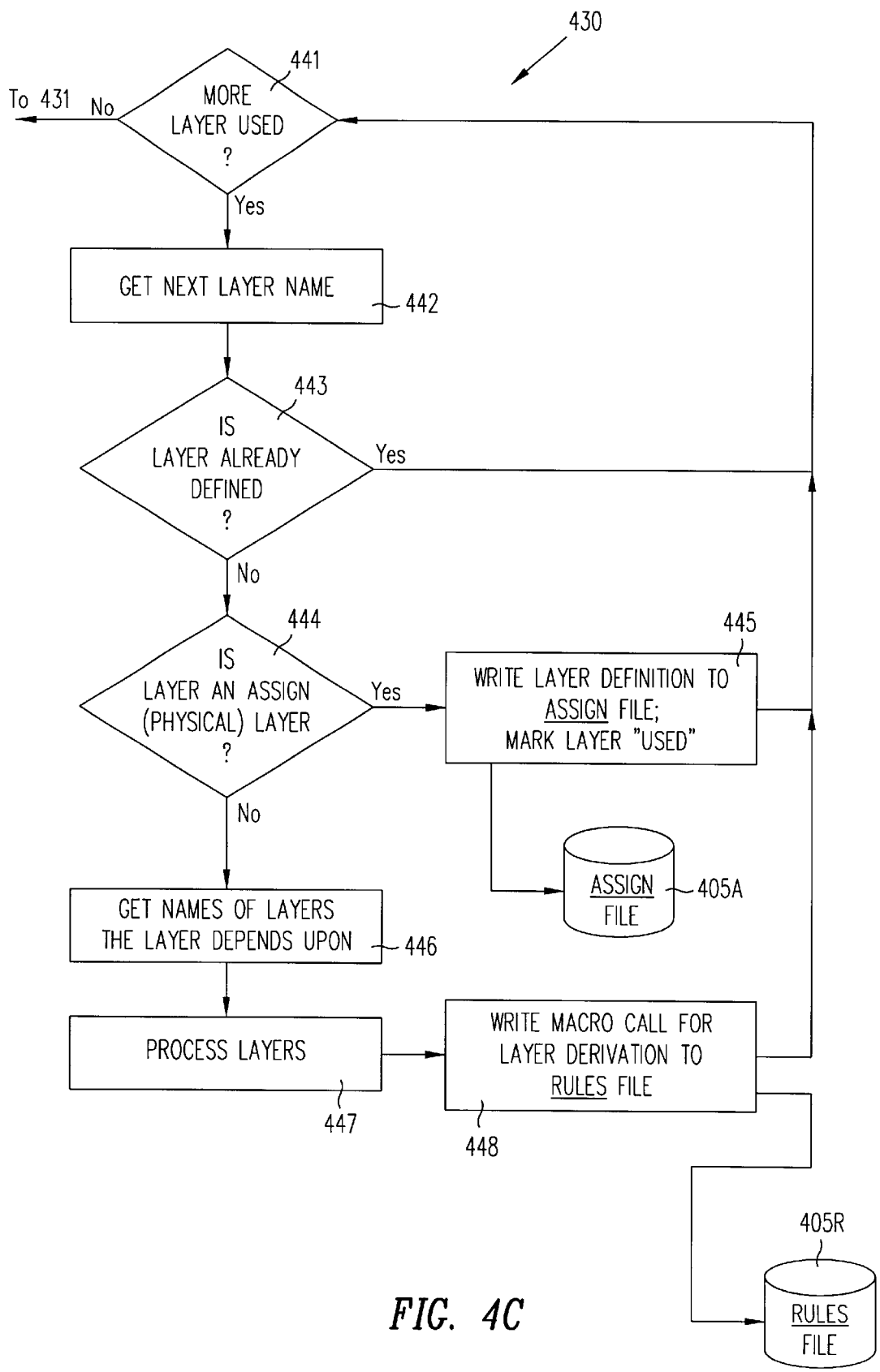

In act 429, procedure 404 parses the line to find the layer names used in the DRC rule, and goes to act 430. In act 430, procedure 404 defines (by writing a layer definition into assign file 405A) any layers that are identified in the DRC rule but are marked as not used, and thereafter marks these layer as used, thereby to implement just-in-time layer definition (therefore, in this implementation, both physical layers and derived layers are defined in a just-in-time manner, although in another implementation, only the derived layers could be defined in the just-in-time manner). Note that act 430 can be implemented as illustrated in FIG. 4C (described below).

Next, procedure 404 uses the two values (e.g. layer value and datatype value) for the error layer to write (see act 431) the DRC rule to rules file 405R. Optionally, procedure 404 also writes to a filters file 405F an instruction for performing an "AND" operation between the just-described error layer and a filter layer (uniquely identified by two values for the filter layer and the filter datatype). Then procedure 404 increments (in act 432) a value for the error layer and a value for the filter layer, for use writing the next DRC rule, and returns to act 411 (described above).

As noted above, act 430 can be implemented by an act 441 wherein if there are no more layers to be processed, procedure 404 goes to act 431 (described above), and otherwise goes to act 442. In act 442, procedure 404 gets the next layer's name and goes to act 443 to check if the layer is already defined (e.g. by searching for the record and on finding the record, checking if the layer is marked as "used;" note that such records can be implemented as an associative array as shown by variables "assign_layers" and "derived_layers" in appendix A in file AriesCode/src/aries.pl.

If layer was previously defined, procedure 404 returns to act 441 (described above). If not defined, procedure 404 goes to act 444 to check (e.g. in the record which was marked as described above in reference to acts 416 and 418), if the layer is a physical layer. If the layer is a physical layer, procedure 404 goes to act 445 and writes a definition for the layer to the assign file 405A. If the layer is a derived layer, procedure 404 gets the names of all layers that the derived layer uses (e.g. from information stored in the record in act 418 as described above), and goes to act 447.

In act 447, procedure 404 recursively performs the acts illustrated in FIG. 4C by starting at act 441 with the layers used to define the derived layer. Once all layers identified in act 446 have been defined by the recursive process, procedure 404 goes to act 448 to write a layer derivation into rules file 405R. In this implementation, the layer derivation is written as a call to a macro defined in the template library 122K (see FIG. 4A; described above), although in other implementations, the actual native code for verification tool 123K can be written directly. Thereafter, procedure 404 returns to act 441 to process any remaining layers.

In another implementation, the runset generator includes an interactive tool containing a Tcl interpreter. Tcl (Tool Command Language) is a public domain scripting language. Through Tcl, the runset generator has a complete shell-like interface and powerful scripting capabilities. Commands have been added to the language to support operations specific to the runset generator. In this implementation, the meta runset can be maintained in text files that are processed by Tcl. In their simplest form these files are merely Tcl scripts containing calls to templates in the library. However, the entire Tcl language is available for developing custom flows and methodologies.

Benefits of using Tcl include: Tcl supplies the runset generator with a complete, powerful, industry-standard shell interface and scripting language enabling the development of custom flows and methodologies. Moreover, the meta runset is independent of verification and layout tools and languages, thereby relieving user of the problems associated with maintaining interfaces to potentially changing environments. Also, the meta runset is easily portable among platforms (due to the public availability of Tcl), and can be directly accessed by independent software that may be prepared by the user.

Therefore, use of a runset generator to translate DRC rules from a meta language into the native language as described herein has the following advantages: reuses code in the native language by use of pre-built DRC templates, reduces development time, simplifies review effort (only review DRC templates, and DRC rules in the meta language, not runsets in the native language), improves consistency, quality, and maintainability, supports regression methodology, tool/language independent, performs/enables runset optimization, just-in-time layer definition, allows user to define rule ordering, focuses expert resources, allows custom DRC templates to be written and integrated into the runset generator when necessary, enables wider use of novice resources, expertise with a particular DRC verification tool is not required, resources with limited knowledge of native language can be effective runset coders.

As noted above, in one embodiment, DRC rules and operations are entered through a graphical user interface (GUI) form, and each DRC rule is "tagged" in the graphical document. For example, a simple spacing rule is illustrated in the GUI form as two shapes with an arrow between them. The arrow is tagged with the spacing value, and this value is extracted and used to create a rule in the native language. This approach is good for visualizing DRC rules in a graphic form.

In one implementation, the runset generator's graphical user interface uses the Tk (Tcl's gui tool-kit) library and thus the runset generator supports Tk calls as part of the Tcl interface. Benefits of using Tk include: graphics eases the learning curve for novice users who are unfamiliar with the runset generator, Tk enables users to create custom graphics that interface with the runset generator and support custom flows and methodologies. Such an approach allows the user to generate, test, and maintain consistent, high-quality runsets in a timely manner with limited resources and expertise.

Figure 5C:
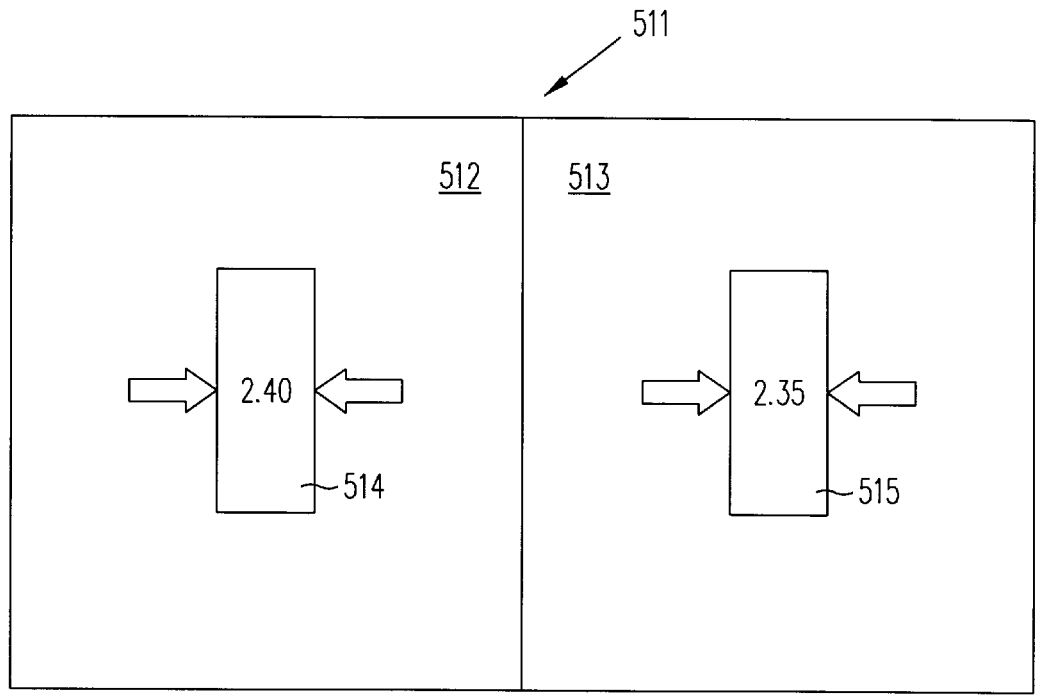
FIG. 5C illustrates a QA cell having two patterns, wherein the left pattern checks that the DRC rule passes and the right pattern checks that the DRC rule fails.

In one embodiment, a runset generator assigns to each rule in a runset a unique error layer, and also assigns a unique filter layer (as noted above). Such a filter layer, when ANDed with the error layer, isolates errors that are specific to the DRC rule being checked. In an example illustrated in FIG. 5A, during execution of a layout verification tool 123K, a number of error shapes 501–503 are generated in an error layer X during the checking of a DRC rule (e.g. a width rule), wherein error shapes 501 and 502 are generated by a circuit element (hereinafter "QA cell") that is designed to test the DRC rule, and error shape 503 is generated by another circuit element (that may be, for example, designed to test another DRC rule such as a spacing rule, but happens to violate the DRC rule being tested, e.g. the width rule). Note that in a display of errors, normally all layers are shown, so that error shapes 504–507 that are generated in other error layers are also displayed in screen 500, as shown in FIG. 5A The shape shows where the error occurred. For example, if two parallel metal lines violated a spacing rule an error shape might be a rectangle stretching between the two metal lines and running the length of the lines to the extent of the violation.].

When the AND operation is performed, with a filter layer X that is assigned for use with the DRC rule being tested, e.g. the width rule, only errors 501 and 502 that are generated by the QA cell during testing of this DRC rule are displayed in screen 510 (in which only the result of a single AND operation is shown), also illustrated in FIG. 5A. This is because, filter layer X has a shape 508 that is of the same extent as the QA cell being used in testing the DRC rule. Therefore, use of filter layer X screens out three types of shapes: shapes 504 and 505 that are generated in other error layers by the QA cell being used in testing the DRC rule, shape 503 that is generated in error layer X by another QA cell that is unrelated to testing the DRC rule, and shapes 506 and 507 that are generated in other error layers by other QA cells.

Note that one or more of these other error shapes that are eliminated by use of filter layer X may actually be relevant to testing of another DRC rule Y. For example, during testing of DRC rule Y, error shape 507 that was generated by an adjacent QA cell and was suppressed by filter layer X, shows up after the AND operation is performed on error layer Y with filter layer Y (not shown in FIG. 5A, but located to the right) and having the same extent as adjacent QA cell.

In the final display, since all results are shown in an overlapping manner, the location of each QA cell will show the error shapes relevant to that particular QA cell. With such a display, the user views only the relevant error shapes, without being distracted by spurious error shapes. Also, the use of AND operations related to filtering can be automated, by use of filters file 405F (described above), thereby eliminating the need for a user to individually select each error layer, for review of results from testing a corresponding DRC rule.

In one embodiment, a QA cell for testing a DRC rule is designed without regard to violation of other DRC rules, because use of the filter layer as described above allows the error shapes relevant to the testing to be isolated from other irrelevant error shapes. One example of such a QA cell 511 (FIG. 5C) includes two portions, a first portion 512 tests if a DRC rule passes a correctly dimensioned circuit element 514 and a second portion 513 tests if the DRC rule fails an incorrectly dimensioned circuit element 515.

Figure 5D:
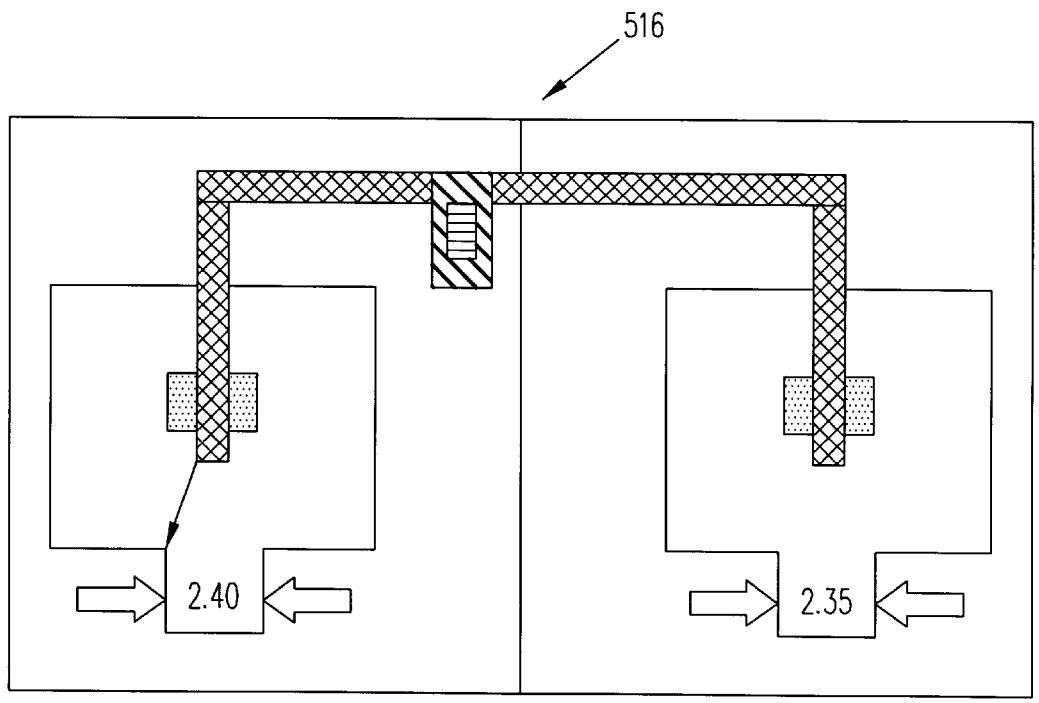
FIG. 5D illustrates a prior art QA cell.

The shapes illustrated for elements 514 and 515 have almost an order of magnitude less complexity than the corresponding elements illustrated in a prior art QA cell 516 (FIG. 5D). Prior art QA cell 516 uses complex shapes in an attempt to avoid generating spurious errors, and is not only time-consuming to draw and maintain but extremely difficult to generate. By using error and filter layers as described herein, QA cell 516 can be replaced with the much simpler QA cell 511 of the type described above.

Figure 6:
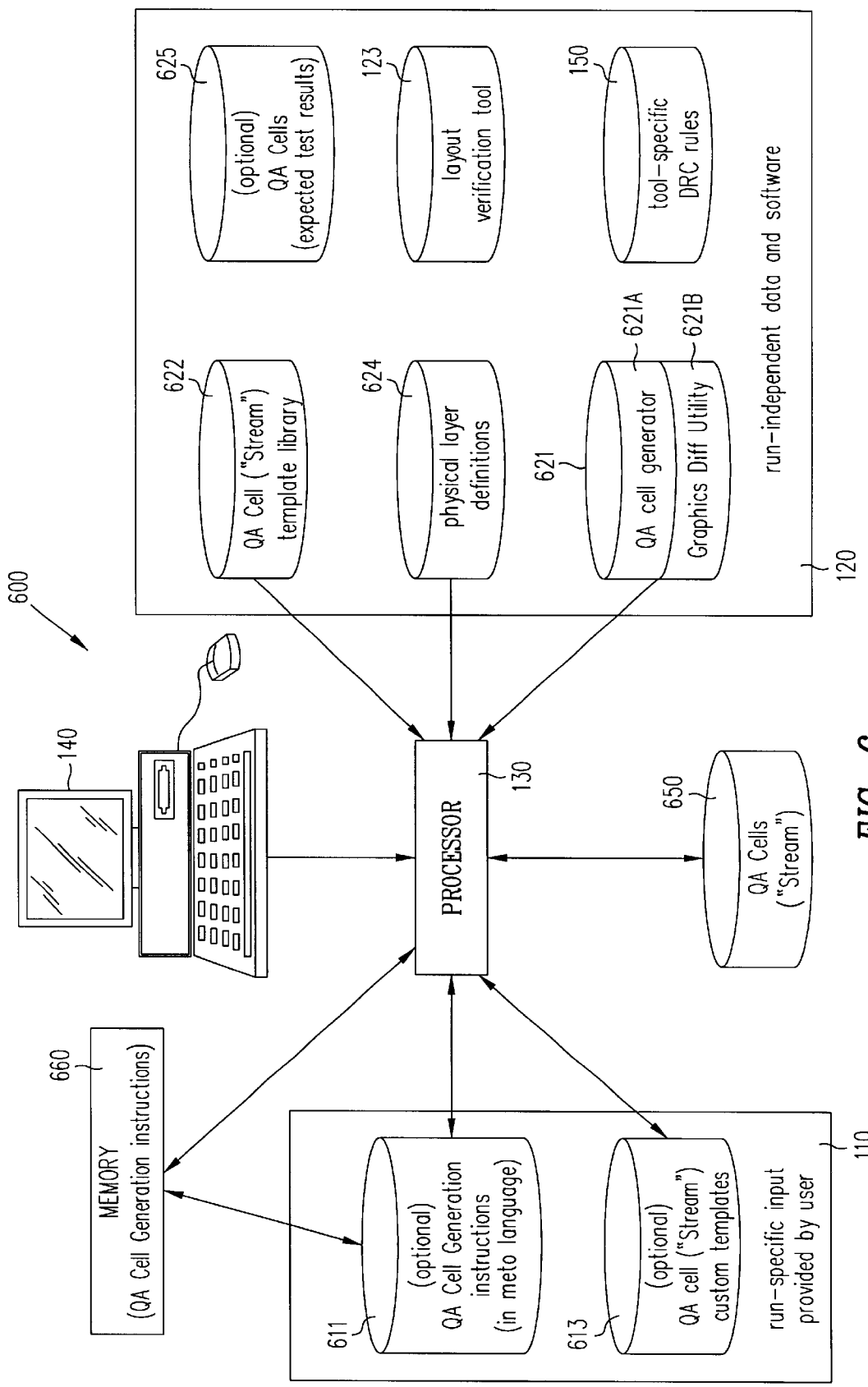
FIG. 6 illustrates, in a high level block diagram, a system for automatic generation of QA cells in accordance with the invention.

In one embodiment, a memory 120 (FIG. 6A) holds software 621 that includes a QA cell generator 621A for automatic generation of QA cells by use of a library of templates 622 in a manner similar to that described above for runset generator 121. Specifically, QA cell generator 621 A uses information provided by a user, e.g. via a graphical user interface, or as instructions in a meta language (e.g. stored in a file 611 illustrated in FIG. 6) to generate the QA cells of appropriate dimensions for testing the corresponding DRC rules. Software related to QA cell generator 621A is illustrated in appendix B by the files with extension ".cc" and ".h" located in the 'qacells' directory as well as main/Interface_qacells.cc.

Automatic generation of QA cells has several advantages: QA cell development and maintenance efforts are dramatically reduced, regression testing using QA cells is simplified, QA cells are easily regenerated when layers or rules change, QA cells have a consistent appearance, template-generated QA cells can be written in an industry-standard format called "stream" thereby to enable the cells to be merged into pre-existing (or to-be-created) QA cell libraries containing other, more complex test data.

Figure 7:
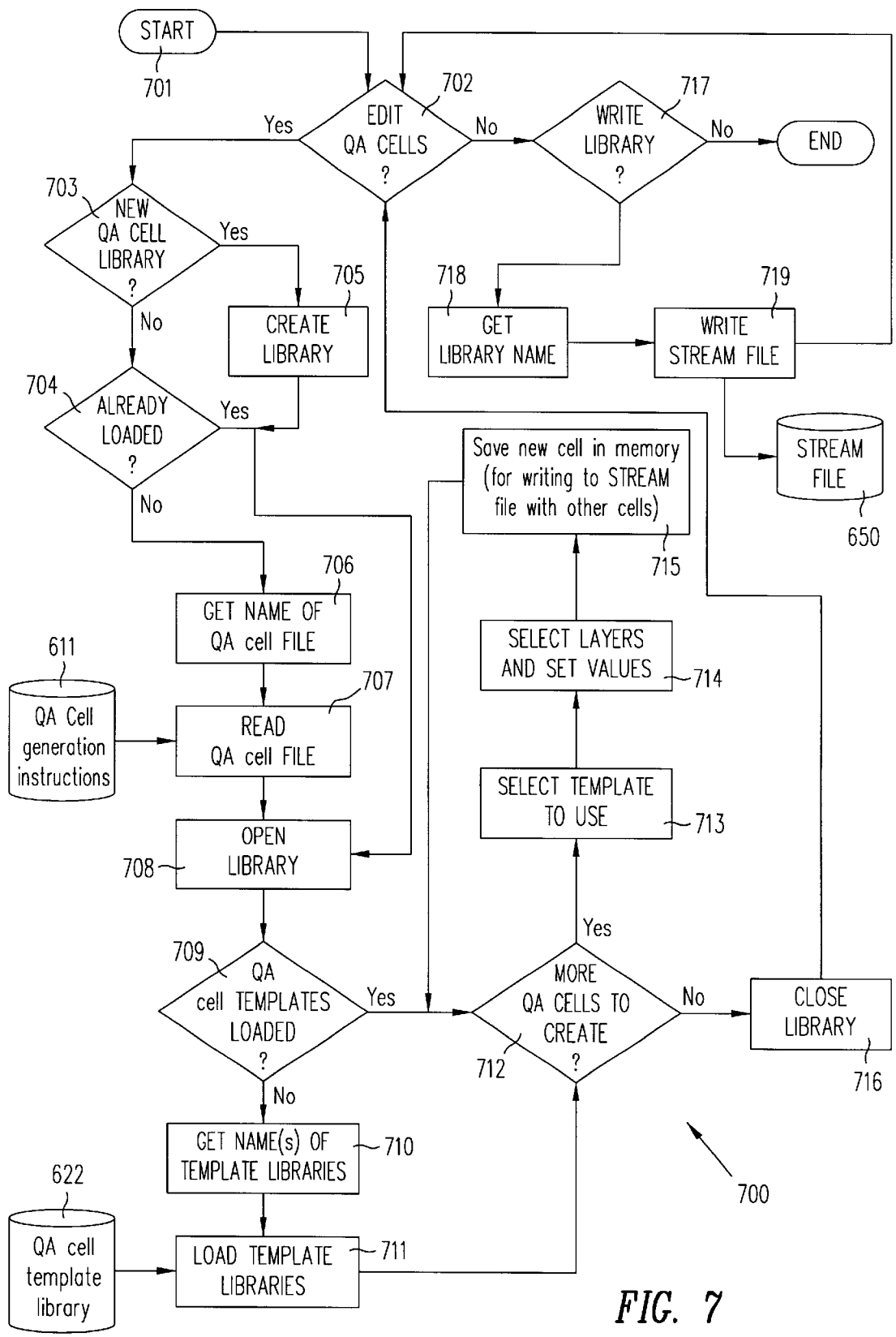
FIG. 7 illustrates, in a flow chart, acts performed by the processor of FIG. 6 when executing the software of a QA cell generator of FIG. 6.
Figure 8:
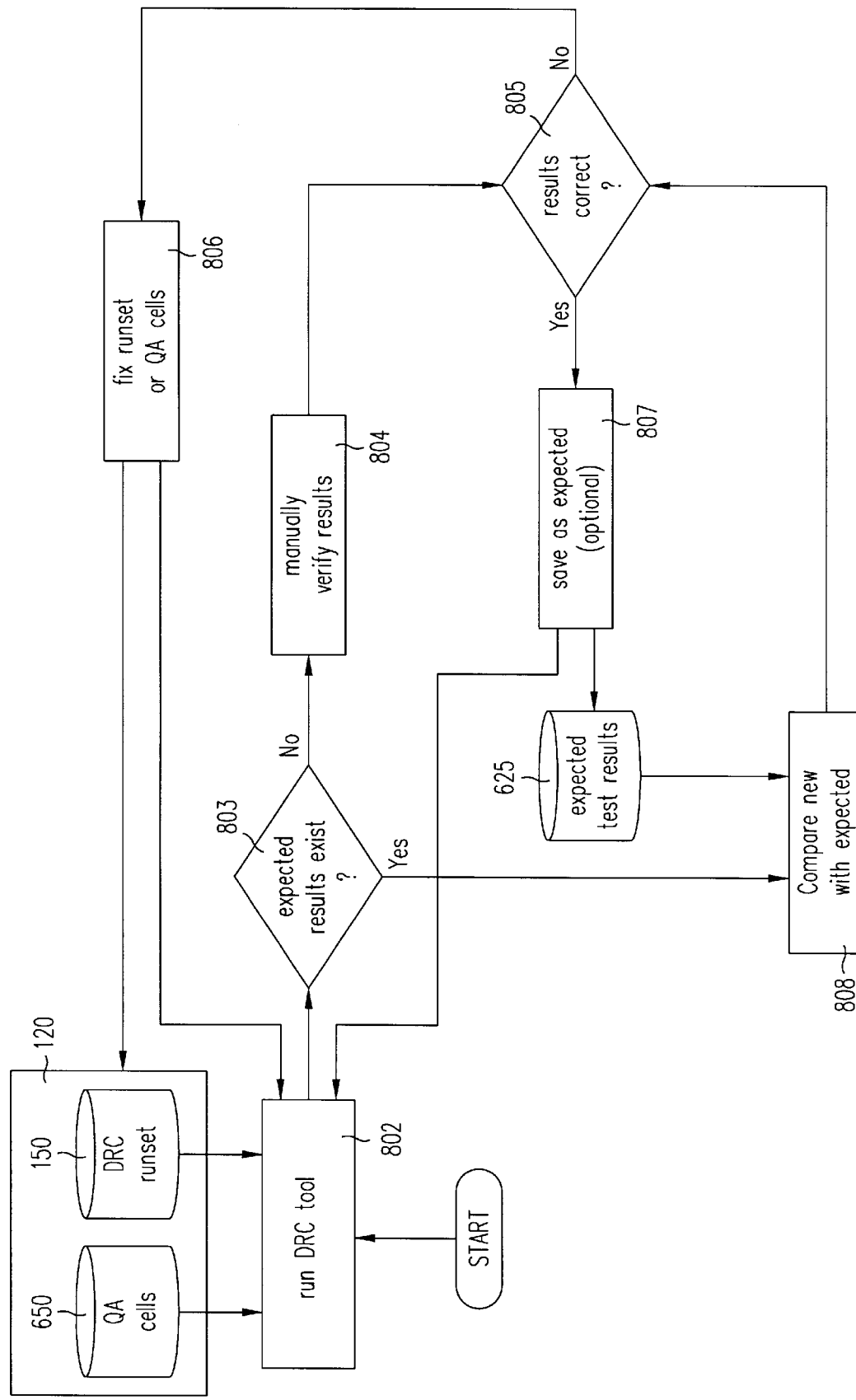
FIG. 8 illustrates, in a high-level flow chart, a regression testing method in accordance with the invention.

In one embodiment, QA cell generator 621A performs the procedure 700 illustrated in FIG. 7. Specifically, procedure 700 starts in act 701, and goes to act 702 to check if any QA cells are to be edited. If so, procedure 700 goes to act 703 to check if a new QA cell library is to be created. If so, procedure 700 goes to act 705 to create the library and thereafter goes to act 708 (described below). If the answer is no in act 703, procedure 700 goes to act 704 to check if the QA cell library is already loaded and if so, goes to act 708 (described below). If the answer is no, procedure 700 goes to act 706 to get from the user the name of file 611 that contains the instructions (in a "meta" language) for creation of the QA cells, and thereafter goes to act 707 to read the instructions from the specified file.

Next, in act 708, procedure 700 opens the library of QA cells, so that QA cells located therein can be deleted, and new QA cells can be added as described below. Thereafter, in act 709, procedure 700 checks if the QA cell templates are loaded, and if so goes to act 712 (discussed below). If the QA cell templates are not loaded, procedure 700 goes to act 710 to get the name(s) of the template library 622, and thereafter goes to act 711 and loads the template libraries, and then goes to act 712 (described below). An example of a template is illustrated in appendix B in the file main/Interface_qacells.cc.

In act 712, procedure 700 checks if more QA cells are to be created, and if so, goes to act 713 to select a template to be used. In act 713, the template is selected from library 622 based on a name of the template supplied by the user, e.g. in file 611 or directly from a GUI. Thereafter, procedure 700 goes to act 714 to select the layers in which circuit elements are to be created for the QA cell, and also to set values of dimensions in the template thereby creating the QA cell, e.g. also based on information supplied by the user, again from file 611 or directly from GUI. Next, procedure 700 goes to act 715 and saves the new cell in memory, e.g. for use in writing to a file as described below in reference to act 719.

In act 712, if there are no more QA cells to be created, procedure 700 goes to act 716 to close the library, and then goes to act 702. In act 702 if no more QA cells are to be edited, procedure 700 goes to act 717 to check if the user wants the library of cells that was created as discussed above to be saved, and if so goes to act 718 to get from the user the name of the library. Thereafter, procedure 700 goes to act 719 to write out a file 650, e.g. in an industry-standard format such as "stream." In act 717, if the library is not to be saved, procedure 700 terminates.

In a regression testing methodology in accordance with the invention, QA cells in file 650 and DRC rules in file 150 (which are preferably, but not necessarily, generated automatically as discussed above) are provided as inputs to a layout verification tool (as illustrated in act 802). Next, in act 803, the user checks if any "expected" test results exist (usually saved from a previous execution of the layout verification tool). If it is the first time this combination of QA cells and DRC rules is supplied as input to the verification tool, there will be no expected results, and the results are checked manually (in act 804). Next, in act 805, if the results are not correct, the user goes to act 806 and manually corrects either or both of files 650 and 150, and returns to act 802. If the results are correct in act 805, the user saves the results in act 807 as "expected" test results for use in future. Thereafter, the user returns to act 802 to again run the verification tool.

From this point onwards, the answer in act 803 is that expected results exist, and the user simply goes to act 808. In act 808, the user uses a utility 621B (FIG. 6) that compares shapes (also called "graphics diff utility"), to automatically compare new results generated by the verification tool with the expected results that were previously saved. If any differences are found, they can be displayed in different colors, thereby allowing the user to focus on these differences.

Figure 9:
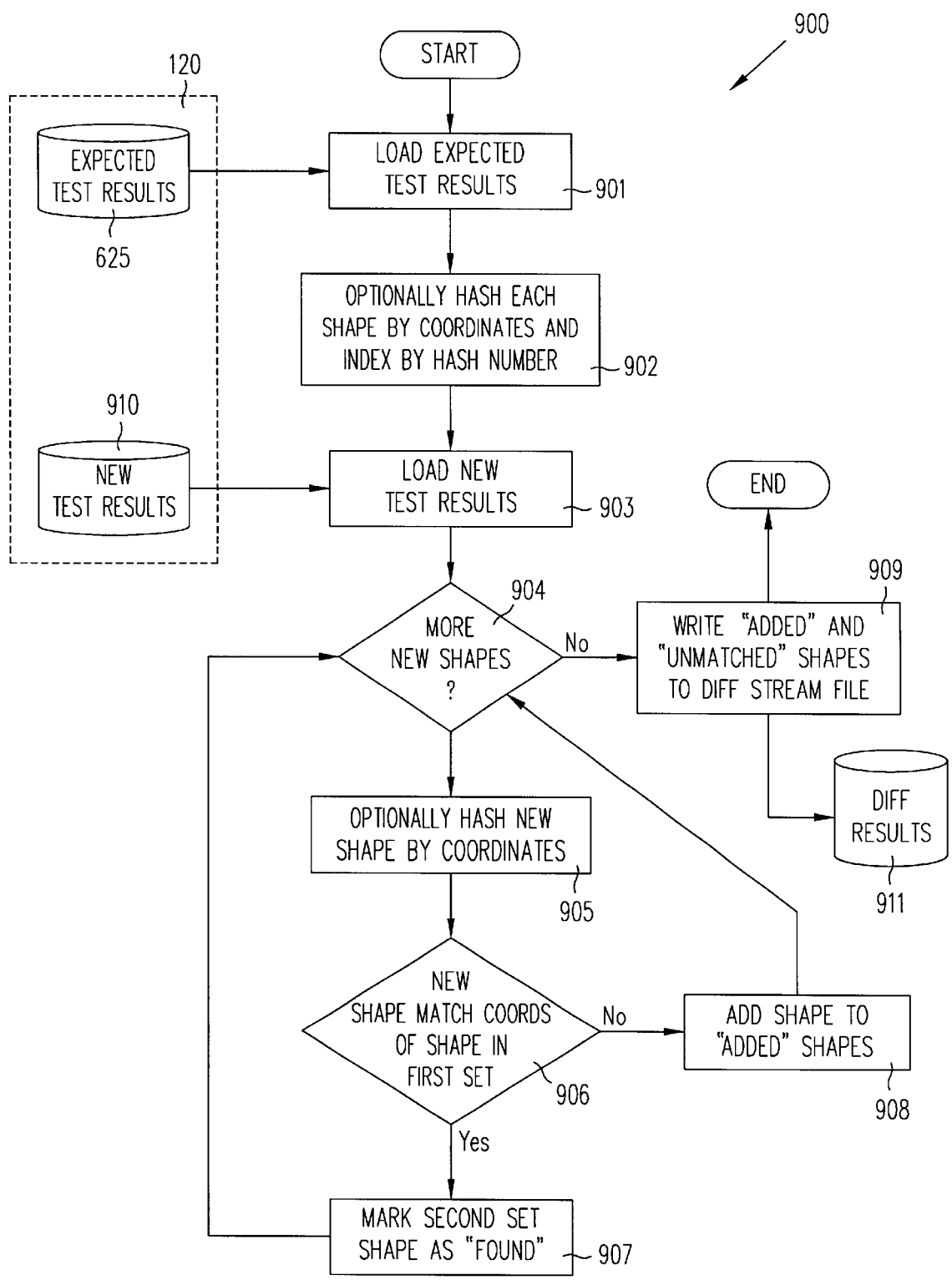
FIG. 9 illustrates, in an intermediate-level flow chart, the acts used to perform the comparison illustrated in FIG. 8.

In one embodiment, utility 621B performs a procedure 900 illustrated in FIG. 9, although other methods for comparing shapes can also be used in accordance with the above-described regression testing methodology. Specifically, in act 901, procedure 900 loads into memory 660 (FIG. 6) a first set of shapes to be compared, e.g. the expected test results from file 625. In this embodiment, each shape is defined in a record having a field that identifies the type of shape (examples include circle, polygon, wire and boundary), and a list of one or more points, each point having two coordinates (e.g. x,y coordinates of the origin of a circle, or of one point in a polygon). The record can also include a field that indicates whether an identical shape is present in a second set of shapes (and vice versa).

Thereafter, procedure 900 performs an optional act 902 of hashing each shape, e.g. by use of a hashing function on the coordinates of all points in the shape, and thereafter indexes the shapes by the hash number. Note that act 902 may be skipped in other embodiments, e.g. if the number of shapes is less than 5. Next, in act 903, procedure 900 loads into memory 660, a second set of shapes that are to be compared with the first set, e.g. from a file 910 containing the new test results. Thereafter, procedure 900 checks if there are any shapes in the second set that have not yet been compared, and this is normally true when act 904 is performed for the first time. If so, procedure 900 goes to act 905 to (optionally) apply the hash function to the shape to be compared, and then goes to act 906. In act 906, procedure 900 compares the shape from the second set with one or more shapes in the first set until a match (or no match) is determined.

In the optional case, when hashing is used, the hash number of the second set shape is used as an index into the first set to find one or more shapes that have the same hash number. Then each point of the second set shape is compared with the corresponding point in the one or more shapes of the same hash number. When hashing is not used, the second set shape may be compared to each shape in the first set.

If there is a match in act 906, procedure 900 goes to act 907, and marks the shape in the first set as "found," and returns to act 904. Depending on the implementation, procedure 900 may also mark the shape in the second set as "found." In act 906, if the second set shape is not found in the first set, procedure 900 goes to act 908 to mark the shape as "added," e.g. by simply setting the value of a flag in a record containing the second set shape, or alternatively by writing a copy or an identity of the second set shape to a list of all added shapes. Thereafter, procedure 900 goes to act 904, and processes any other shapes in the second set that have not been processed so far. When all shapes of the second set have been processed (by acts 905 and 906), procedure 900 finds the answer in act 904 is "no" and goes to act 909. In act 909, procedure 900 displays (or writes to a file 911): (1) shapes that were "added" or (2) shapes that were "not found" or (3) shapes that were "found", or some combination thereof. All these three types of shapes can be displayed, for example in three different colors.

Therefore, when a DRC runset changes, or when a new version of the verification tool is used, the QA cells may be used in accordance with the above-discussed regression testing methodology to automatically identify any differences in the results. Such automated comparisons eliminate the possibility of human error associated with reviewing large quantities of test results. Moreover, the test review time is dramatically reduced. Also, use of "stream" for the template-generated QA cells allows these QA cells to avoid dependence on specific tools.

Numerous modifications and adaptations of the embodiments and implementations described herein will be apparent to the skilled artisan in view of the enclosed disclosure. For example, instead of using C or C++, the DRC templates can be written in any language. Moreover, instead of defining a layer by writing a name of a template into a file for later expansion, a layer can be defined by (1) writing an instruction for defining the layer, in a native language of the layout verification tool or (2) making a function call to a library of functions, a majority of functions in the library writing at least one instruction in the native language.

Furthermore, software of a runset generator can be integrated into the layout verification tool, so that the act of defining a layer may include allocating memory for holding information related to the layer, and subsequent to the "allocating" and prior to defining another layer, such software checks if a layout conforms to the DRC rule. Also, procedure 900 need not be limited to comparing shapes produced by a verification tool, e.g. can be used for comparison of two versions of the same drawing that has been manually changed.

Moreover, one or more techniques and structures described herein can be used independent of all the other techniques and structures, or in combination of one or more of each other. Furthermore, one or more techniques and structures described herein can be used for other technologies, such as checking of layout vs. schematic (LVS) for logical connectivity.

Specifically, templates for rules in LVS are basically device definitions that describe how each type of device is constructed. Usually, a particular set of layers used in a specific way constitute a device, and "recognition" layers are frequently used. Recognition layers are used by the CAD system to identify various types of devices. The LVS automation system can also make use of the recognition layers in the device templates, allowing portability between various target verification tools. Following is a very simple example showing the use of a layer "stack" with a recognition layer:

QA cells for LVS are different than for DRC since errors in LVS are not due to size tolerances, but are due to malformed devices. For example, in a DRC QA cell, two shapes have a distance as in the example for Rule Mapping. Varying the distance causes errors, by being too close, etc. For an LVS QA cell, errors are created by using inappropriate layers, or by leaving out layers, or otherwise creating an illegal layer structure. Each of these cases may create a device of another type, or an illegal device is created.

The QA cells must attempt to catch all of these types of errors, to make sure that each combination is either marked as legal or illegal. A simple case is a missing recognition layer: even though all the device layers are present, a missing recognition layer prevents proper device detection. In that case, a different device may be detected, and the QA cell can be set up as that illegal or different device. Since LVS QA cells differ little from one process to another, the main function of the QA cell template mapper is to map layers only. Each basic device type is the same in most processes, only the layers are different. Therefore, the QA cell mapper for LVS is much simpler than for DRC.

LVS checking also includes verifying the sizes of the devices being checked. Each device has a specified size, and LVS must verify that size is correct, within a certain tolerance. Here again, illegal devices can be of the wrong size or not meet an exact X and Y size. Polarity is also a factor in some devices, such as resistors. QA cells must be able to check polarity along with device size. Error cases for each of these must be created, and the expected results checked for.

Error reports are generally much more complicated for LVS than for DRC. In many cases, wiring hook-up errors and shorts cause LVS errors in designs. For the case of the LVS QA cells, the focus is on device recognition. In either case, error report processing is more advanced and will require more compute resources and software development. Error report generation and processing is necessary for that very reason however, since humans also must read the more complicated reports.

In terms of modules, LVS is dependent on many of the DRC modules already covered: the device definitions are the verification source language for the automation system, device templates work the same way that rule templates work for DRC, except the only mapping is for layers, LVS regression testing is basically the same as for DRC. As can be seen from the above list, automating the LVS runset development is very similar to automating the DRC portion. Although LVS is significantly more complicated, the same approaches can be used. These approaches hinge around the templates for devices and QA cells, while maintaining the CM and regression methodology. Error processing is also more complicated, possibly requiring new approaches to LVS error reporting.

Various such modifications and adaptations are encompassed by the attached claims.

What is claimed is:

1. A method for automatically checking for errors in a layout of an integrated circuit (IC) design by use of a plurality of design rule check (DRC) rules, the method comprising:

specifying, for each DRC rule, a unique number of an error layer which uniquely identifies said error layer from among a plurality of error layers; and checking if said layout conforms to each DRC rule in the plurality, and in case of a failure related to a DRC rule, writing an error about the failure to the error layer identified by the unique numbers.

2. The method of claim 1 further comprising:

specifying, for each DRC rule, a unique number of a filter layer to be logically operated with the error layer to uniquely identify the failure.

3. The method of claim 1 further comprising:

generating at least one instruction to perform a DRC check in a native language of a layout verification tool, and write said error to the error layer identified by the unique number; and using the layout verification tool during said "checking."

4. The method of claim 3 wherein the layout includes at least one quality assurance (QA) cell to be used in testing the DRC rule, the method further comprising, prior to said act of generating:

receiving, from a user, information related to said QA cell, the information including the name of a template to be used to create said layout; and searching for the template having the name that is received from the user; and on finding the template, creating at least one instruction to define said QA cell by use of the template and the information received from the user.

5. A computer-readable memory encoded with a plurality of records, each record including a DRC rule to be used in checking an integrated circuit (IC) design and a unique number of an error layer to be used to indicate a failure related to said DRC rule, wherein the unique number uniquely identifies said error layer from among a plurality of error layers.

6. The computer-readable memory of claim 5 further including a command to perform a logical operation on the error layer of the DRC rule with a unique filter layer, to uniquely identify a failure related to the DRC rule from among other failures.

7. The computer-readable memory of claim 5 further comprising:

a library of templates, each template being of the type used in creation of at least one instruction to define a quality assurance (QA) cell.

8. The computer-readable memory of claim 7 wherein:

the template includes a macro definition in a high level programming language.

9. The computer-readable memory of claim 7 wherein:

the template includes a function definition in a high level programming language.

* * * * *